(12) United States Patent
Hai et al.

(10) Patent No.: US 11,075,240 B2
(45) Date of Patent: Jul. 27, 2021

(54) TEXTURE RECOGNITION ASSEMBLY AND METHOD OF MANUFACTURING THE SAME, AND DISPLAY APPARATUS

(71) Applicant: BOE TECHNOLOGY GROUP CO., LTD., Beijing (CN)

(72) Inventors: Xiaoquan Hai, Beijing (CN); Haisheng Wang, Beijing (CN); Lei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/607,251

(22) PCT Filed: Feb. 28, 2019

(86) PCT No.: PCT/CN2019/076558
§ 371 (c)(1),
(2) Date: Oct. 22, 2019

(87) PCT Pub. No.: WO2019/218752
PCT Pub. Date: Nov. 21, 2019

(65) Prior Publication Data
US 2020/0403018 A1 Dec. 24, 2020

(30) Foreign Application Priority Data
May 17, 2018 (CN) .......................... 201810476167.3

(51) Int. Cl.
*H01L 27/146* (2006.01)
*G06K 9/00* (2006.01)
(Continued)

(52) U.S. Cl.
CPC ...... *H01L 27/14621* (2013.01); *G06K 9/0004* (2013.01); *G06K 9/209* (2013.01);
(Continued)

(58) Field of Classification Search
CPC .............. H01L 27/14621; G06K 9/209; G02F 1/13318
See application file for complete search history.

(56) References Cited

U.S. PATENT DOCUMENTS 5,446,290 A * 8/1995 Fujieda .................... G06K 7/14
250/227.11
7,366,331 B2 * 4/2008 Higuchi ............... A61B 5/1172
382/124

(Continued)

FOREIGN PATENT DOCUMENTS

| CN | 106526944 A | 3/2017 |
| CN | 106873063 A | 6/2017 |

(Continued)

OTHER PUBLICATIONS

International Search Report and Written Opinion issued in corresponding International Application No. PCT/CN2019/076558, dated Jun. 5, 2019, with English language translation.

*Primary Examiner* — William Coleman
(74) *Attorney, Agent, or Firm* — McDermott Will and Emery LLP

(57) ABSTRACT

A texture recognition assembly, a method of manufacturing the same, and a display apparatus are disclosed. The texture recognition assembly includes a photosensitive sensing layer, a texture contact layer, and a filter film layer disposed at a side of the photosensitive sensing layer proximate to the texture contact layer. The filter film layer is configured to filter visible light with a wavelength greater than or equal to $\lambda$. A value of $\lambda$ is greater than or equal to 600 nm.

18 Claims, 9 Drawing Sheets

(51) Int. Cl.
  *G06K 9/20*     (2006.01)
  *G02F 1/133*    (2006.01)
  *H01L 25/18*    (2006.01)
  *H01L 27/32*    (2006.01)

(52) U.S. Cl.
  CPC .... *H01L 27/14685* (2013.01); *G02F 1/13318* (2013.01); *H01L 25/18* (2013.01); *H01L 27/14612* (2013.01); *H01L 27/3234* (2013.01)

(56) References Cited

U.S. PATENT DOCUMENTS

| | | | |
|---|---|---|---|
| 8,204,283 B2 * | 6/2012 | Wu | G06K 9/00046 |
| | | | 382/124 |
| 8,649,001 B2 * | 2/2014 | Wu | G06K 9/00046 |
| | | | 356/71 |
| 9,934,418 B2 * | 4/2018 | Mienko | G06K 9/0004 |
| 10,024,655 B2 * | 7/2018 | Raguin | A61B 5/117 |
| 10,387,712 B2 * | 8/2019 | Zeng | G06K 9/001 |
| 10,489,630 B2 * | 11/2019 | Wu | G06K 9/00067 |
| 2018/0233531 A1 * | 8/2018 | Huang | H01L 27/14678 |
| 2019/0331940 A1 * | 10/2019 | Poole | G06F 3/041 |
| 2020/0074138 A1 * | 3/2020 | Sun | H01L 27/3225 |
| 2020/0210672 A1 * | 7/2020 | Zhao | G06K 9/0004 |

FOREIGN PATENT DOCUMENTS

| | | |
|---|---|---|
| CN | 108038479 A | 5/2018 |
| KR | 20150029129 A | 3/2015 |

\* cited by examiner

TEXTURE RECOGNITION ASSEMBLY AND METHOD OF MANUFACTURING THE SAME, AND DISPLAY APPARATUS

CROSS-REFERENCE TO RELATED APPLICATION

This application is a national phase entry under 35 USC 371 of International Patent Application No. PCT/CN2019/076558 filed on Feb. 28, 2019, which claims priority to Chinese Patent Application No. 201810476167.3, filed with the Chinese Patent Office on May 17, 2018, titled "TEXTURE RECOGNITION ASSEMBLY AND METHOD OF MANUFACTURING THE SAME, AND DISPLAY APPARATUS", which is incorporated herein by reference in their entirety.

TECHNICAL FIELD

The present disclosure relates to the field of display technologies, and in particular, to a texture recognition assembly and a method of manufacturing the same, and a display apparatus.

BACKGROUND

Fingerprint recognition refers to identification of an individual by comparing details of different fingerprints. Fingerprint recognition is mainly implemented by three manners: capacitive, optical, and ultrasonic manners.

In a process of using an optical manner (e.g., photosensitive sensor) to perform fingerprint recognition, since light that bounces off a finger may scatter, and there is usually a distance between the finger and a photosensitive sensor, the photosensitive sensor will receive the scattered light. As a result, an image acquired by the photosensitive sensor will be blurred, and fingerprint information identified by the photosensitive sensor according to the received light will be inaccurate.

SUMMARY

In an aspect, some embodiments of the present disclosure provide a texture recognition assembly. The texture recognition assembly includes a photosensitive sensing layer, a texture contact layer, and a filter film layer disposed at a side of the photosensitive sensing layer proximate to the texture contact layer. The filter film layer is configured to filter visible light with a wavelength greater than or equal to $\lambda$, and a value of $\lambda$ is greater than or equal to 600 nm.

In some embodiments of the present disclosure, the texture recognition assembly further includes a first light-transmitting layer and a second light-transmitting layer are disposed on a first side and a second side of the filter film layer respectively, and the first light-transmitting layer and the second light-transmitting layer are both in contact with the filter film layer. The filter film layer includes K filter film groups that are stacked, K being a positive integer greater than or equal to 1. Each of the K filter film groups includes two first films disposed opposite to each other, and a second film disposed between the two first films. A refractive index of the second film is greater than a refractive index of the first film. A thickness of the first film is $$\frac{\lambda}{8},$$

and a thickness of the second film is $$\frac{\lambda}{4}.$$

A value of K is determined according to a formula $$T = \frac{16 \cdot n_1 \cdot n_2}{\left(\frac{n_g}{n_d}\right)^{2K} \cdot \left[(n_1 + n_2)^2 + \left(\frac{n_1 \cdot n_2}{n_d} - n_d\right)^2\right]}.$$

T is a transmittance of visible light with a wavelength greater than or equal to $\lambda$ in the filter film layer, and T is less than a threshold value of the transmittance of visible light with a wavelength greater than or equal to $\lambda$ in the filter film layer. $n_1$ is a refractive index of the first light-transmitting layer, $n_2$ is a refractive index of the second light-transmitting layer, $n_g$ is a refractive index of the second film, and $n_d$ is a refractive index of the first film.

In some embodiments of the present disclosure, the threshold value of the transmittance of visible light with a wavelength greater than or equal to $\lambda$ in the filter film layer is less than 3%; or the threshold value of the transmittance of visible light with a wavelength greater than or equal to $\lambda$ in the filter film layer is equal to 3%.

In some embodiments of the present disclosure, a material of the first film includes SiO or $SiO_2$; and a material of the second film includes $TiO_2$ or Ge.

In some embodiments of the present disclosure, the first light-transmitting layer includes a base substrate, and the second light-transmitting layer includes an optically transparent adhesive layer or a buffer layer.

In some embodiments of the present disclosure, the texture recognition assembly further includes a base substrate disposed at a side of the filter film layer proximate to the texture contact layer. The first light-transmitting layer includes an optical layer or an encapsulation layer; and the second light-transmitting layer includes an optically transparent adhesive layer.

In some embodiments of the present disclosure, the texture recognition assembly further includes an optical layer disposed at the side of the photosensitive sensing layer proximate to the texture contact layer. The optical layer includes a plurality of light-transmitting holes. The photosensitive sensing layer includes a plurality of photosensitive sensing units, and each of the plurality of photosensitive sensing units corresponds to a light-transmitting hole.

In some embodiments of the present disclosure, along a direction from the photosensitive sensing layer to the filter film layer, the photosensitive sensing layer includes a first electrode layer, a photosensitive material layer, and a second electrode layer that are sequentially arranged.

In another aspect, some embodiments of the present disclosure provide a display apparatus. The display apparatus includes a light-emitting layer, and the texture recognition assembly described above. The filter film layer in the texture recognition assembly is disposed at a side of the light-emitting layer away from the texture contact layer in the texture recognition assembly.

In some embodiments of the present disclosure, the display apparatus further includes an organic light-emitting diode (OLED) display panel. The light-emitting layer is a layer consisting of a plurality of OLED light-emitting devices of the OLED display panel. The OLED display panel includes an array substrate, and the array substrate includes a substrate. The texture recognition assembly includes a base substrate, and the base substrate is used as the substrate of the array substrate.

In yet another aspect, some embodiments of the present disclosure provide a method of manufacturing a texture recognition assembly. The method includes: forming a photosensitive sensing layer, forming a filter film layer, and forming a texture contact layer. The filter film layer is disposed between the photosensitive sensing layer and the texture contact layer, and the filter film layer is configured to filter visible light with a wavelength greater than or equal to λ. A value of λ is greater than or equal to 600 nm.

In some embodiments of the present disclosure, the method of manufacturing a texture recognition assembly further includes: forming a first light-transmitting layer and a second light-transmitting layer on a first side and a second side of the filter film layer respectively. The first light-transmitting layer and the second light-transmitting layer are in contact with the filter film layer respectively.

In some embodiments of the present disclosure, the step of forming a filter film layer includes: sequentially forming K filter film groups, the K filter film groups being stacked, and K being a positive integer greater than or equal to 1. A step of forming each of the K filter film groups includes: sequentially forming a first film, a second film, and a first film. A refractive index of the second film is greater than a refractive index of the first film. A thickness of first film is $$\frac{\lambda}{8},$$

and a thickness of the second film is $$\frac{\lambda}{4}.$$

A value of K is determined according to a formula $$T = \frac{16 \cdot n_1 \cdot n_2}{\left(\frac{n_g}{n_d}\right)^{2K} \cdot \left[(n_1 + n_2)^2 + \left(\frac{n_1 \cdot n_2}{n_d} - n_d\right)^2\right]}.$$

T is a transmittance of visible light with a wavelength greater than or equal to λ in the filter film layer, and T is less than a threshold value of the transmittance of visible light with a wavelength greater than or equal to λ in the filter film layer. $n_1$ is a refractive index of the first light-transmitting layer, $n_2$ is a refractive index of the second light-transmitting layer, $n_g$ is a refractive index of the second film, and $n_d$ is a refractive index of the first film.

In some embodiments of the present disclosure, the step of forming the first light-transmitting layer, includes forming a base substrate. The step of forming a second light-transmitting layer, includes forming a buffer layer. The filter film layer and the second light-transmitting layer are sequentially formed at a side of the base substrate proximate to the texture contact layer. Or the step of forming a first light-transmitting layer, includes forming a base substrate. The step of forming a second light-transmitting layer, includes forming an optically transparent adhesive layer. The filter film layer and the second light-transmitting layer are sequentially formed at a side of the base substrate proximate to the photosensitive sensing layer.

In some embodiments of the present disclosure, the method of manufacturing a texture recognition assembly further includes: forming a base substrate. The step of forming a texture contact layer, includes forming a texture contact layer at a side of the base substrate away from the filter film layer. The step of forming a first light-transmitting layer, includes forming an optical layer or an encapsulation layer. The step of forming a second light-transmitting layer, includes forming an optically transparent adhesive layer. The first light-transmitting layer, the filter film layer and the second light-transmitting layer are sequentially formed at a side of the base substrate away from the texture contact layer; or the first light-transmitting layer, the filter film layer and the second light-transmitting layer are sequentially formed at a side of the photosensitive sensing layer proximate to the base substrate.

In some embodiments of the present disclosure, the method of manufacturing a texture recognition assembly further includes: forming an optical layer at a side of the photosensitive sensing layer proximate to the texture contact layer, the optical layer including a plurality of light-transmitting holes. The step of forming a photosensitive sensing layer includes: forming a plurality of photosensitive sensing units, each of the plurality of photosensitive sensing units corresponding to a light-transmitting hole.

In some embodiments of the present disclosure, the step of forming a photosensitive sensing layer includes: sequentially forming a first electrode layer, a photosensitive material layer and a second electrode layer.

In some embodiments of the present disclosure, the optical layer is disposed at the side of the filter film layer proximate to the photosensitive sensing layer; or the optical layer is disposed at the side of the filter film layer away from the photosensitive sensing layer.

In some embodiments of the present disclosure, the texture recognition assembly further includes at least one thin film transistor electrically connected to the first electrode layer, and a controller electrically connected to the at least one thin film transistor. The photosensitive sensing layer is configured to convert received optical signals related to texture information into electrical signals. The at least one thin film transistor is configured to control the photosensitive sensing layer to transmit the electrical signals to the controller. The controller is configured to perform texture recognition according to the received electrical signals.

In some embodiments of the present disclosure, an arrangement manner of the first electrode layer and the second electrode layer includes at least one of: the first electrode layer includes a plurality of first electrodes, a projection of each first electrode on the texture contact layer overlaps with a projection of the second electrode layer on the texture contact layer; the first electrode layer includes a plurality of first electrodes, and the second electrode layer includes a plurality of second electrodes, a projection of a single first electrode on the texture contact layer overlaps with a projection of a corresponding second electrode on the texture contact layer; or the second electrode layer includes a plurality of second electrodes, a projection of each second electrode on the texture contact layer overlaps with a projection of the first electrode layer on the texture contact layer.

BRIEF DESCRIPTION OF THE DRAWINGS

In order to describe technical solutions in some embodiments of the present disclosure more clearly, the accompanying drawings to be used in description of the embodiments will be introduced briefly. Obviously, the accompanying drawings to be described below are merely some embodiments of the present disclosure, and a person of ordinary skill in the art can obtain other drawings according to these drawings.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments obtained on the basis of the embodiments of the present disclosure by a person of ordinary skill in the art shall be included in the protection scope of the present disclosure.

In some embodiments of the present disclosure, unless otherwise specified, "a plurality of" refers to two or more than two; "and/or" merely describes an association of associated objects, which include three situations. For example, "A and/or B" refers to three situations: A alone, A and B, and B alone. Terms "first" and "second" are used to distinguish between same or similar items whose functions and effects are substantially the same. A person skilled in the art will understand that the terms "first" and "second" are not intended to limit a quantity and an order of execution of the items, and do not limit a difference among the items.

Figure 1:
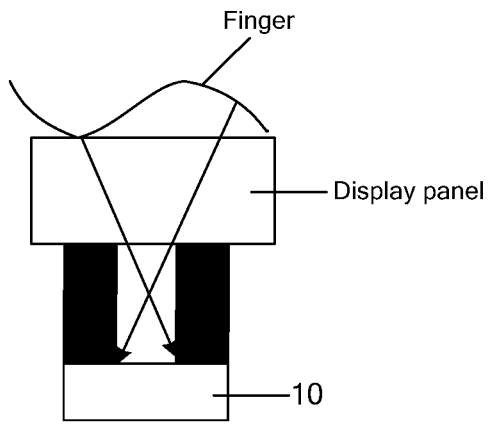
FIG. 1 is a schematic diagram showing a structure of a display apparatus in the related art.
Figure 2A:
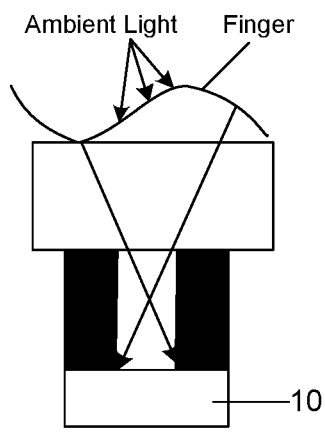
FIG. 2a is a schematic diagram showing light passing through a finger and reaching a photosensitive sensing layer in accordance with some embodiments of the present disclosure.
Figure 2B:
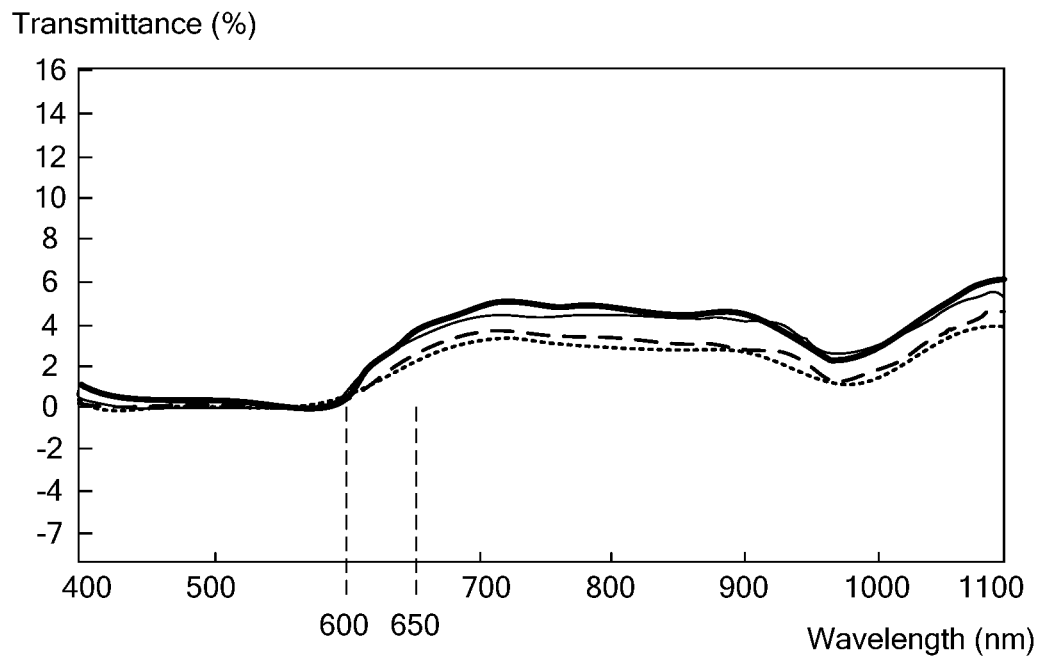
FIG. 2b is a spectrogram of light passing through a finger and reaching a photosensitive sensing layer in accordance with some embodiments of the present disclosure.

As shown in FIG. 1, in the related art, a through-hole is used to filter scattered light that bounces off a finger, so as to obtain more accurate fingerprint information. However, even with this through-hole filtering method, an accuracy of fingerprint recognition is still affected by interfering light. For example, as shown in FIG. 2a, after ambient light is irradiated onto the finger, a portion of ambient light will pass through the finger and reach the photosensitive sensor 10, becoming interfering light that interferes with fingerprint recognition. After passing through the finger, the portion of the ambient light will be changed by biological tissues inside the finger. However, according to test results of a spectrograph, as shown in FIG. 2b, the portion of the ambient light that passes through the finger and reaches the photosensitive sensor 10 is mainly in a long band with a wavelength above 600 nm, and cannot be filtered by the through-hole filtering method. As a result, light in this band range will still affect the accuracy of fingerprint recognition.

Figure 3:
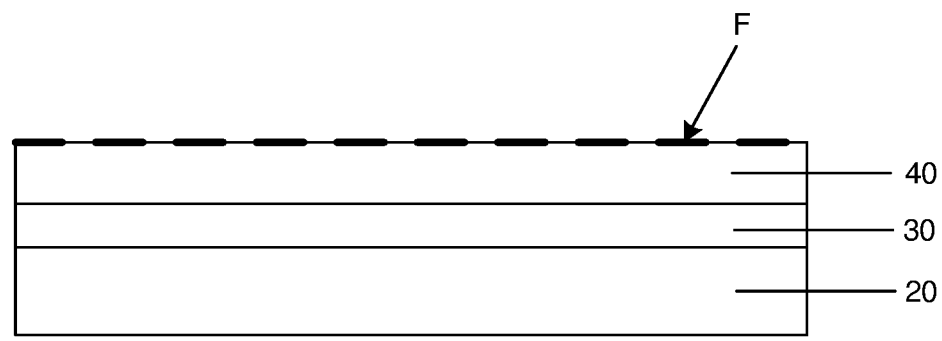
FIG. 3 is a schematic diagram showing a structure of a texture recognition assembly in accordance with some embodiments of the present disclosure.

Some embodiments of the present disclosure provide a texture recognition assembly. As shown in FIG. 3, the texture recognition assembly includes a photosensitive sensing layer 20, a texture contact layer 40, and a filter film layer 30 disposed at a side of the photosensitive sensing layer 20 proximate to the texture contact layer 40. The filter film layer 30 is configured to filter visible light with a wavelength greater than or equal to $\lambda$. A value of the wavelength $\lambda$ is greater than or equal to 600 nm.

A texture recognition principle of the texture recognition assembly may be described as below. After light reaches a textured object (such as a fingerprint) and is reflected by a trough (hereinafter referred to as a valley) or a crest (hereinafter referred to as a ridge) of the object, a light energy of reflected light will be different. A light energy of a light beam reflected by the valley will be lower than a light energy of a light beam reflected by the ridge. The photosensitive sensing layer 20 performs texture recognition based on a difference in the light energies of the received light.

It will be noted that, first, the texture recognition assembly is configured to recognize textured objects such as a fingerprint or a palmprint, which is not limited in some embodiments of the present disclosure. For convenience of explanation, a detailed description will be given below by taking recognizing a fingerprint as an example.

Second, in the texture recognition assembly, when an user's fingerprint is being recognized, the texture contact layer 40 is in direct contact with the user's finger. As shown in FIG. 3, a surface of the texture contact layer 40 that is in direct contact with the user's finger is a texture contact surface F. In a case where the texture recognition assembly is disposed in a display apparatus, the texture contact surface F of the texture contact layer 40 refers to a surface of the display apparatus that is in direct contact with the user's finger when the user's fingerprint is being recognized.

The texture contact layer 40 is, for example, a cover plate on an outermost side of the texture recognition assembly or the display apparatus. The texture contact surface F is, for example, a surface on a side of the cover plate of the texture contact layer 40 away from the photosensitive sensing layer 20. The cover plate is made of, for example, glass.

Third, the description that the filter film layer 30 is used to filter visible light with a wavelength greater than or equal to λ means that: the filter film layer 30 is able to reduce a transmittance of all visible light with a wavelength greater than or equal to λ. Herein, a film layer includes one film or multilayer films. A specific transmittance of visible light with a wavelength greater than or equal to λ passing through the filter film layer 30 is related to a specific structure of the filter film layer 30 and the number of layers of film(s) in the filter film layer 30.

Figure 4:
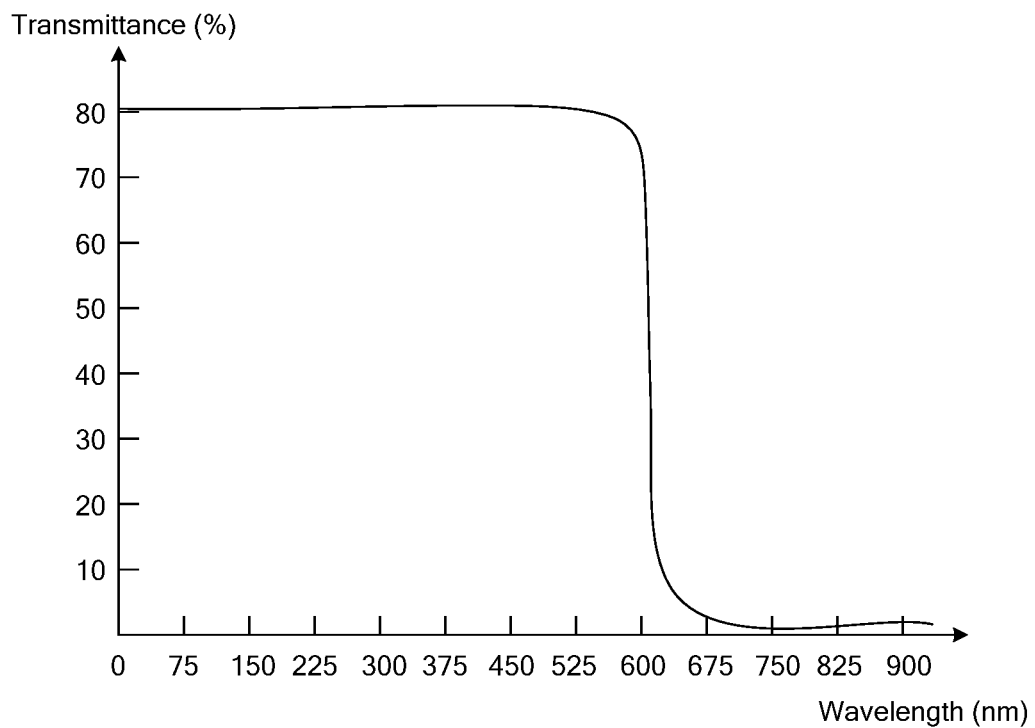
FIG. 4 is another spectrogram of light passing through a finger and reaching a photosensitive sensing layer in accordance with some embodiments of the present disclosure.

For example, in a case where λ is equal to 600 nm, transmittances of light with different wavelengths passing though the filter film layer 30 are as shown in FIG. 4. The texture recognition assembly itself includes a plurality of film layers, even though the plurality of film layers in the texture recognition assembly are made of light-transmitting materials, the film layers all have a certain transmittance. Therefore, even without passing through the filter film layer 30, light that bounces off the finger and reaches the photosensitive sensing layer 20 will be weakened to a certain extent. Based on this, it is assumed that a transmittance of light that bounces off the finger and reaches the photosensitive sensing layer 20 is 80% in a case where light does not pass through the filter film layer 30. Then, in a case where light passes through the filter film layer 30, as shown in FIG. 4, a transmittance of light with a wavelength less than 600 nm is only slightly affected by the filter film layer 30, and is still close to 80%; however, the transmittance of visible light with a wavelength greater than or equal to 600 nm is reduced from 80% to about 1%.

Fourth, some embodiments of the present disclosure do not limit a value of λ, as long as the value of λ is above 600 nm (including 600 nm) and is within a range of visible light. For example, the value of λ is 600 nm, 650 nm, 700 nm, 750 nm, or 800 nm.

Considering that in the test results of the spectrograph as shown in FIG. 2b, the portion of the ambient light that passes through the finger and reaches the photosensitive sensor 10 is mainly in a long band with a wavelength above 600 nm, therefore, in some embodiments of the present disclosure, the value of λ is set to 600 nm. In this way, by choosing a suitable structure for the filter film layer 30, visible light with a wavelength greater than or equal to 600 nm may be filtered out, thereby reducing an influence of visible light with a wavelength greater than or equal to 600 nm on the accuracy of fingerprint recognition.

Fifth, some embodiments of the present disclosure do not limit a specific structure of the filter film layer 30, as long as the filter film layer 30 is able to filter out visible light with a wavelength greater than or equal to λ.

Figure 6A:
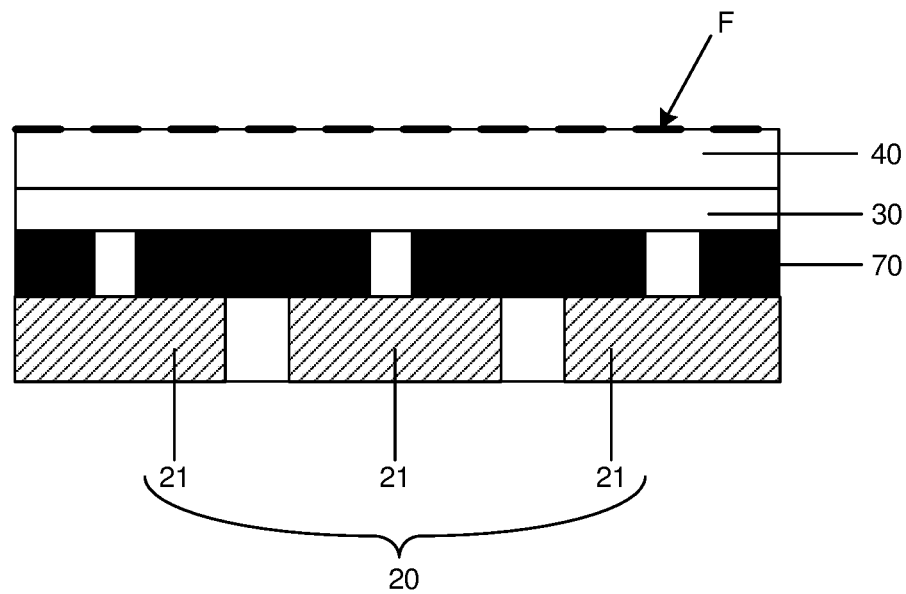
FIG. 6a is a schematic diagram showing a structure of yet another texture recognition assembly in accordance with some embodiments of the present disclosure.
Figure 6B:
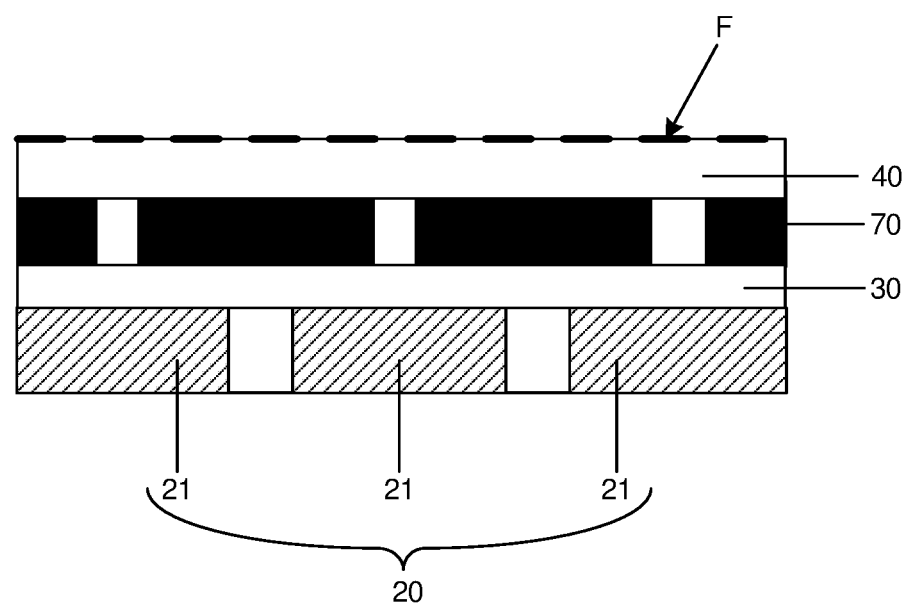
FIG. 6b is a schematic diagram showing a structure of yet another texture recognition assembly in accordance with some embodiments of the present disclosure.

Sixth, as shown in FIGS. 6a and 6b, in some embodiments of the present disclosure, the photosensitive sensing layer 20 includes a plurality of photosensitive sensing units 21, and each photosensitive sensing unit 21 is configured to convert optical signals related to texture information into electrical signals. That is, the optical signals includes light reflected by the valley and light reflected by the ridge. The photosensitive sensing unit 21 is, for example, a photosensitive sensor, a photoelectric sensor, etc.

Seventh, some embodiments of the present disclosure do not limit an arrangement manner of the plurality of photosensitive sensing units 21 in the photosensitive sensing layer 20, as long as it is possible to perform fingerprint recognition when the finger touches any position of the texture contact surface F of the texture contact layer 40, and regions occupied by the plurality of photosensitive sensing units 21 do not affect normal display of the display apparatus in a case where the texture recognition assembly is applied to a display apparatus. The plurality of photosensitive sensing units 21 are arranged, for example, in a matrix, or in a staggered array.

Some embodiments of the present disclosure provide a texture recognition assembly. With a filter film layer 30 disposed at the side of the photosensitive sensing layer 20 proximate to the texture contact layer 40, the texture recognition assembly is able to filter out visible light with a wavelength greater than or equal to λ. On one hand, in a case where there is a certain distance between the finger and the photosensitive sensing layer 20, light that scatters after being reflected by the finger may be reduced by filtering out visible light with a wavelength greater than or equal to λ, thereby ensuring that the photosensitive sensing layer 20 recognizes fingerprint information more accurately. On another hand, since the portion of the ambient light that passes through the finger and reaches the photosensitive sensing layer 20 is mainly in a long band with a wavelength above 600 nm, by setting λ to a value greater than or equal to 600 nm, it is possible to effectively filter out the portion of the ambient light that passes through the finger and reaches the photosensitive sensing layer 20, and thus improve the accuracy of fingerprint recognition.

In addition, in some embodiments of the present disclosure, a side of the photosensitive sensing layer 20 away from the texture contact layer 40 is shaded from light. That is, the side of the photosensitive sensing layer 20 away from the texture contact layer 40 is provided with a light-shielding layer, which is able to prevent light at the side of the photosensitive sensing layer 20 away from the texture contact layer 40 from entering the photosensitive sensing layer 20 and affecting the accuracy of fingerprint recognition.

Figure 5:
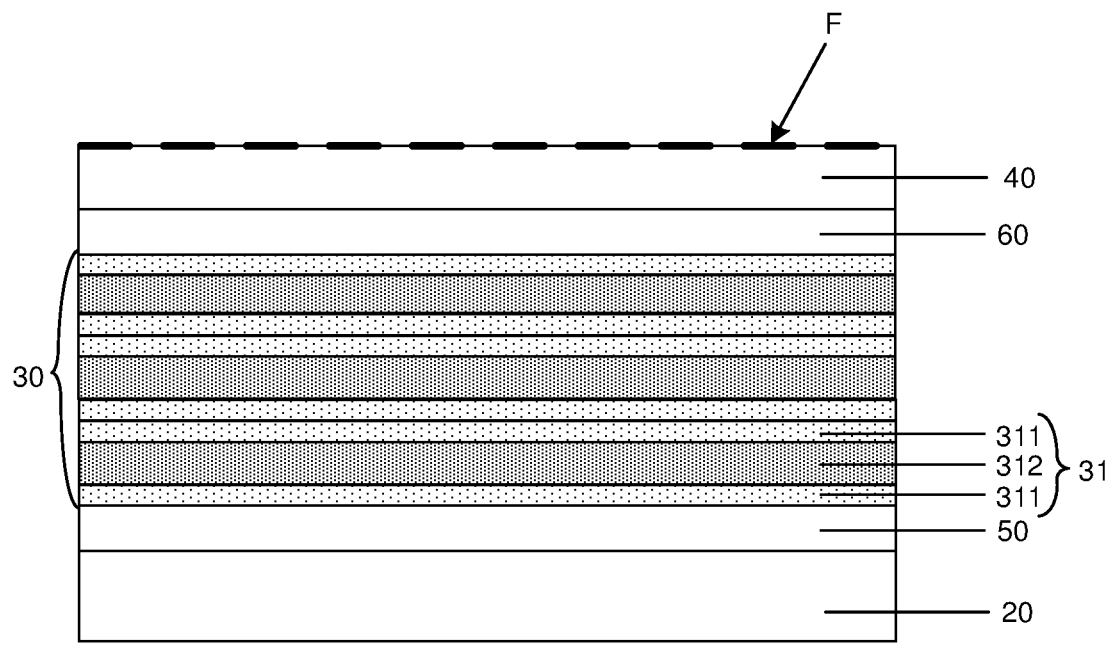
FIG. 5 is a schematic diagram showing a structure of another texture recognition assembly in accordance with some embodiments of the present disclosure.

In some embodiments of the present disclosure, as shown in FIG. 5, a first light-transmitting layer 50 and a second light-transmitting layer 60 are disposed on both sides of the filter film layer 30 respectively, and the first light transmitting layer 50 and the second light-transmitting layer 60 are in contact with the filter film layer 30 respectively.

The filter film layer 30 includes K filter film groups 31 that are stacked, K being a positive integer greater than or equal to 1. Each of the K filter film groups 31 includes two first films 311 disposed opposite to each other, and a second film 312 disposed between the two first films 311. A refractive index of the second film 312 is greater than a refractive index of the first film 311. A thickness of the first film 311 is $$\frac{\lambda}{8},$$

and a thickness of the second film 312 is $$\frac{\lambda}{4}.$$

A value of K is determined according to a formula $$T = \frac{16 \cdot n_1 \cdot n_2}{\left(\frac{n_g}{n_d}\right)^{2K} \cdot \left[(n_1 + n_2)^2 + \left(\frac{n_1 \cdot n_2}{n_d} - n_d\right)^2\right]}.$$

T is a transmittance of visible light with a wavelength greater than or equal to λ in the filter film layer 30, and T is less than a threshold value of the transmittance of visible light with a wavelength greater than or equal to λ in the filter film layer 30. $n_1$ is a refractive index of the first light-transmitting layer 50, $n_2$ is a refractive index of the second light-transmitting layer 60, $n_g$ is a refractive index of the second film 312, and $n_d$ is a refractive index of the first film 311.

It will be noted that, first, the description that a first light-transmitting layer 50 and a second light-transmitting layer 60 are disposed on both sides of the filter film layer 30 respectively means that: both sides of the filter film layer 30 are provided with a light-transmitting layer; and a light-transmitting layer on a side of the filter film layer 30 proximate to the photosensitive sensing layer 20 is the first light-transmitting layer 50, or a light-transmitting layer on a side of the filter film layer 30 away from the photosensitive sensing layer 20 is the first light-transmitting layer 50. For example, as shown in FIG. 5, the first light-transmitting layer 50 is disposed on the side of the filter film layer 30 proximate to the photosensitive sensing layer 20, and the second light-transmitting layer 60 is disposed on the side of the filter film layer 30 away from the photosensitive sensing layer 20. For another example, the first light-transmitting layer 50 is disposed on the side of the filter film layer 30 away from the photosensitive sensing layer 20, and the second light-transmitting layer 60 is disposed on the side of the filter film layer 30 proximate to the photosensitive sensing layer 20.

Second, first films 311 of different filter film groups 3 are made of a same material or different materials. Similarly, second films 312 of different filter film groups 3 are made of a same material or different materials. That is to say, the filter film layer 30 is composed of K filter film groups 31 with a same filter effect or different filter effects. Some embodiments of the present disclosure do not limit materials of the first film 311 and the second film 312 in each filter film group 31, as long as the refractive index of the second film 312 in each filter film group 31 is greater than the refractive index of the first film 311 in a same filter film group 31.

For example, in each filter film group 31, materials that can be easily made into a thin film by a simple process are adopted as materials of the first film 311 and the second film 312, and it is arranged that there is a large difference between refractive indexes of the first film 311 and the second film 312, so that the transmittance of visible light with a wavelength greater than or equal to λ in the filter film layer 30 is still lower. In each filter film group 31, a material of the first film 311 is, for example, one of SiO or $SiO_2$, and a material of the second film 312 is, for example, one of $TiO_2$ or Ge. In a case where λ is equal to 600 nm, a refractive index of $SiO_2$ is 1.44, a refractive index of SiO is 1.8, a refractive index of $TiO_2$ is 2.12, and a refractive index of Ge is 4.0.

In each filter film group 31, the first film 311 and the second film 312 are formed by a spraying or a coating process. The coating process is, for example, a normal temperature coating process, or a high temperature coating process. The normal temperature coating process is, for example, an ion assisted deposition (IAD) process.

Third, the filter film layer 30 includes K filter film groups 31 that are stacked, and in a case where K>1, a plurality of filter film groups 31 are stacked along a direction from the photosensitive sensing layer 20 to the texture contact layer 40.

It will be understood by those skilled in the art that in a case where K represents the number of the filter film groups 31, K should be an integer. As for a specific value of K, in a case where T is less than the threshold value of the transmittance of visible light with a wavelength greater than or equal to λ in the filter film layer 30, the value of K is determined by the formula $$T = \frac{16 \cdot n_1 \cdot n_2}{\left(\frac{n_g}{n_d}\right)^{2K} \cdot \left[(n_1 + n_2)^2 + \left(\frac{n_1 \cdot n_2}{n_d} - n_d\right)^2\right]}.$$

FIG. 5 is a structural diagram of the filter film layer 30 in a case where K is equal to 3, but the number of the filter film groups 31 is not limited thereto in some embodiments of the present disclosure, and the number of the filter film groups 31 K may also be, for example, 2, 4, 5, 6, 8, or 10.

In an example where K is equal to 3, a process of fabricating a filter film layer 30 includes: sequentially forming a first film 311, a second film 312, a first film 311, a first film 311, a second film 312, a first film 311, a first film 311, a second film 312, and a first film 311.

Fourth, those skilled in the art will understand that, since the filter film layer 30 in the embodiments of the present disclosure can filter out visible light with a wavelength greater than or equal to λ, in a case where light does not pass through the filter film layer 30, a transmittance of visible light with a wavelength greater than or equal to λ that travels from the finger to the photosensitive sensing layer 20 in the texture recognition assembly is necessarily greater than the threshold value of the transmittance of visible light with a wavelength greater than or equal to λ in the filter film layer. The threshold value of the transmittance of visible light with a wavelength greater than or equal to λ in the filter film layer is related not only to transmittances of light in the filter film layer 30 and other light-transmitting film layers in the texture recognition assembly, but also to a performance of the photosensitive sensing units 21 in the photosensitive sensing layer 20.

For example, the threshold value of the transmittance of visible light with a wavelength greater than or equal to λ in the filter film layer is less than 3%. For another example, the threshold value of the transmittance of visible light with a wavelength greater than or equal to λ in the filter film layer is less than or equal to 1%. In this case, the transmittance of light with a wavelength greater than or equal to λ that travels from the finger to the photosensitive sensing layer 20 may be considered to be close to zero and is negligible, and the accuracy of fingerprint recognition is increased to the greatest extent.

In some embodiments of the present disclosure, suitable materials are adopted so that the refractive index of the second film 312 is greater than the refractive index of the first film 311. The number of the filter film groups 30 is determined by a K value calculated on a premise that the transmittance of visible light with a wavelength greater than or equal to λ in the filter film layer 30 is less than the threshold value of the transmittance of visible light with a wavelength greater than or equal to λ in the filter film layer 30. In this way, a specific structure of the filter film layer 30 will be obtained, so that the filter film layer 30 is capable of filtering out visible light with a wavelength greater than or equal to λ. The structure of the filter film layer 30 is simple and easy to form.

In some embodiments of the present disclosure, as shown in FIGS. 6a and 6b, the texture recognition assembly further includes an optical layer 70 disposed at the side of the photosensitive sensing layer 20 proximate to the texture contact layer 40. The optical layer 70 includes a plurality of light-transmitting holes, and each photosensitive sensing unit 21 in the photosensitive sensing layer 20 corresponds to a light-transmitting hole.

It will be understood that, regions where the plurality of light-transmitting holes are located in the optical layer 70 are light-transmitting regions, and regions surrounding each light-transmitting hole of the optical layer 70 are opaque regions.

Based on the pinhole imaging principle, the optical layer 70 including a plurality of light-transmitting holes is able to solve a problem of blurred image formed by the photosensitive sensing layer 20 due to mixed light. Or, the optical layer 70 including a plurality of light-transmitting holes is, for example, a collimator, so as to prevent light between the finger and the texture contact layer 40 from reaching the photosensitive sensing layer 20 at a large angle (a direction perpendicular to the optical layer 70 is set as a normal direction, and the larger the angle between a light direction and the normal direction, the larger the angle of the light), or prevent light with a large angle in light reflected by the finger from reaching the photosensitive sensing layer 20, and thus to improve the accuracy of fingerprint recognition.

It will be noted that, some embodiments of the present disclosure do not limit a relative position between the filter film layer 30 and the optical layer 70, as long as the filter film layer 30 and the optical layer 70 are both disposed at the side of the photosensitive sensing layer 20 proximate to the texture contact layer 40. For example, as shown in FIG. 6a, the optical layer 70 is disposed at the side of the filter film layer 30 proximate to the photosensitive sensing layer 20. For another example, as shown in FIG. 6b, the optical layer 70 is disposed at the side of the filter film layer 30 away from the photosensitive sensing layer 20.

On this basis, the filter film layer 30 and the optical layer 70 are, for example, in direct contact with each other, or are separated by other film layer(s). FIGS. 6a and 6b only show a structure of the texture recognition assembly in a case where the filter film layer 30 and the optical layer 70 are in direct contact with each other.

It will be further noted that, in some embodiments of the present disclosure, in the case where the optical layer 70 is in direct contact with the filter film layer 30, the optical layer 70 may also be used as other film layer(s) in the texture recognition assembly. For example, the optical layer 70 may also be used as the first light-transmitting layer 50 or the second light-transmitting layer 60. That is to say, the first light-transmitting layer 50 or the second light-transmitting layer 60 is the optical layer 70.

In some embodiments of the present disclosure, by providing an optical layer 70 at the side of the photosensitive sensing layer 20 proximate to the texture contact layer 40, and using opaque regions of the optical layer 70 to block stray light and light with a large angle that reaches the optical layer 70, an interference of stray light and light with a large angle on light required for the photosensitive sensing layer 20 to recognize fingerprints will be reduced, and the accuracy of fingerprint recognition may be improved.

In some embodiments of the present disclosure, the texture recognition assembly includes a base substrate 80. The base substrate 80 may be used as the first light-transmitting layer 50, or may be configured to be an independent film layer in the texture recognition assembly, that is, in some embodiments of the present disclosure, the base substrate 80 is not used as other film layer.

Figure 7A:
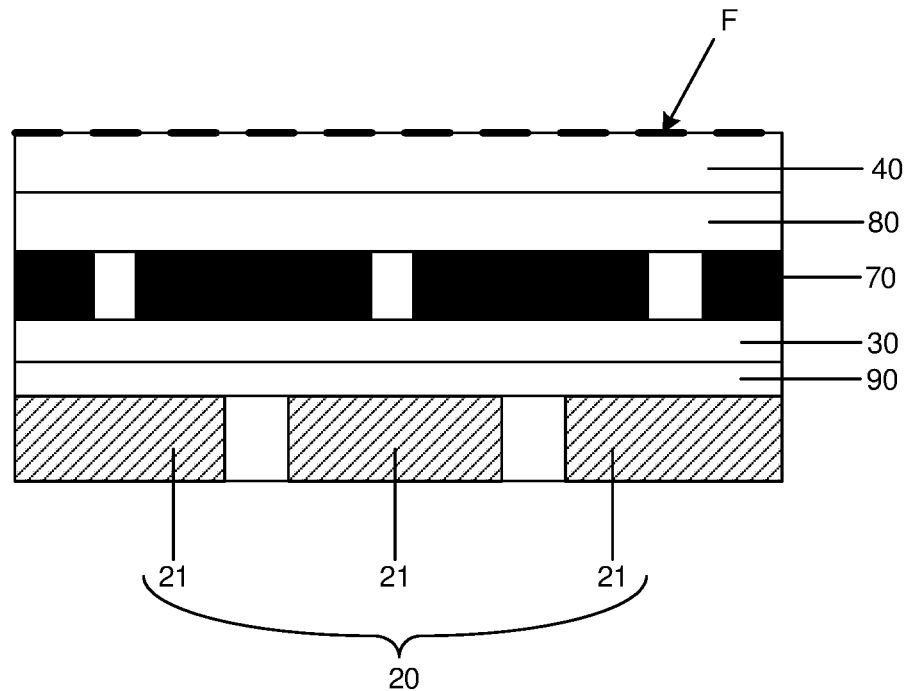
FIG. 7a is a schematic diagram showing a structure of yet another texture recognition assembly in accordance with some embodiments of the present disclosure.
Figure 7B:
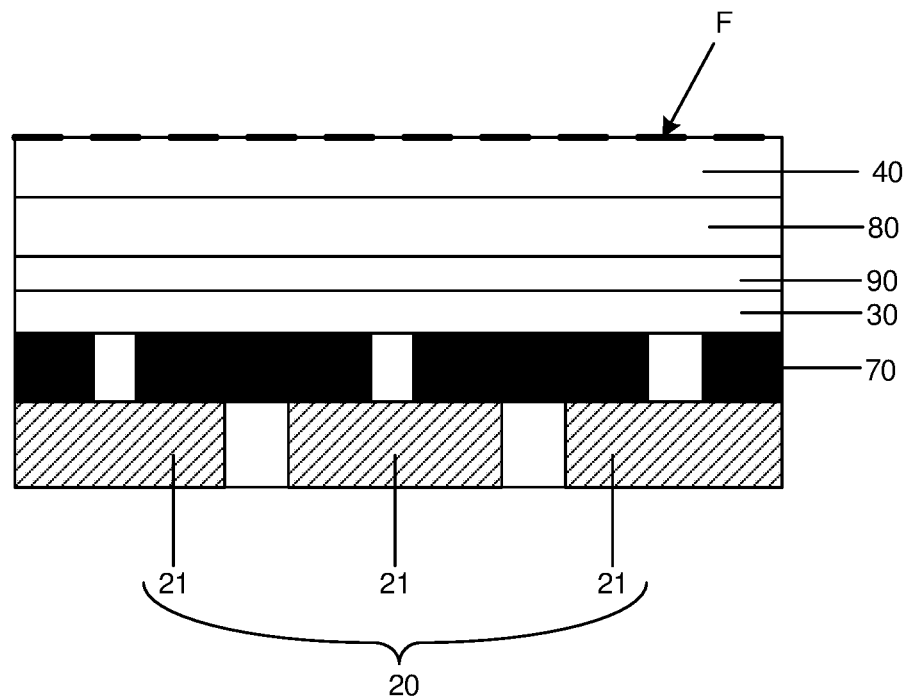
FIG. 7b is a schematic diagram showing a structure of yet another texture recognition assembly in accordance with some embodiments of the present disclosure.

In a case where the base substrate 80 is configured to be an independent film layer in the texture recognition assembly, in some embodiments of the present disclosure, as shown in FIGS. 7a and 7b, the texture recognition assembly further includes a base substrate 80 disposed at a side of the filter film layer 30 proximate to the texture contact layer 40. Herein, the first light-transmitting layer 50 is the optical layer 70, and the second light-transmitting layer 60 is the optically transparent adhesive layer 90.

The optical layer 70 is used as the first light-transmitting layer 50 in the texture recognition assembly.

It will be noted that, first, as shown in FIG. 7a, the filter film layer 30 is disposed on a side of the optical layer 70 proximate to the photosensitive sensing layer 20; or, as shown in FIG. 7b, the filter film layer 30 is disposed on a side of the optical layer 70 away from the photosensitive sensing layer 20.

For example, as shown in FIG. 7b, in a case where the filter film layer 30 is disposed at the side of the optical layer 70 away from the photosensitive sensing layer 20, the optical layer 70 is directly formed on the photosensitive sensing layer 20, or the optical layer 70 is adhered to the photosensitive sensing layer 20. Then, the filter film layer 30 is directly formed and fixed on the optical layer 70. Finally, a surface on the side of the filter film layer 30 away from the optical layer 70 is adhered to a surface of another film layer in the texture recognition assembly by the optically transparent adhesive layer 90. For example, the surface on the side of the filter film layer 30 away from the optical layer 70 100 is adhered to the base substrate 80 by the optically transparent adhesive layer 90.

In some embodiments of the present disclosure, a material of the optically transparent adhesive layer 90 is, for example, optically clear adhesive (OCA).

Second, the plurality of light-transmitting holes in the optical layer 70 are through-holes, or light-transmitting materials are disposed in the light-transmitting holes. For example, a material of a portion of the optical layer 70 where a light-transmitting hole is located is a light-transmitting material, and a material of other portions of the optical layer 70 except for the light-transmitting holes is an opaque material. In a case where the filter film layer 30 is directly formed and fixed on the optical layer 70 and is in direct contact with the optical layer 70, by providing light-transmitting materials in the light-transmitting holes, it may be possible to avoid a situation in which unbalanced forces at positions of the through holes in the filter film layer 30 and other positions of the filter film layer 30 affect a structure of the filter film layer 30 and thereby affect a filter effect of the filter layer 30 in a case where the light-transmitting holes of the optical layer 70 are through holes.

In some embodiments of the present disclosure, the filter film layer 30 may be directly formed and fixed on the optical layer 70, and a fabrication method thereof is simple. Moreover, since the filter film layer 30 is directly formed and fixed on the optical layer 70, in a process of fabricating the filter film layer 30, structures and performances of other layers, such as the photosensitive sensing layer, in the texture recognition assembly will not be affected even if a high temperature coating process is used.

Figure 8A:
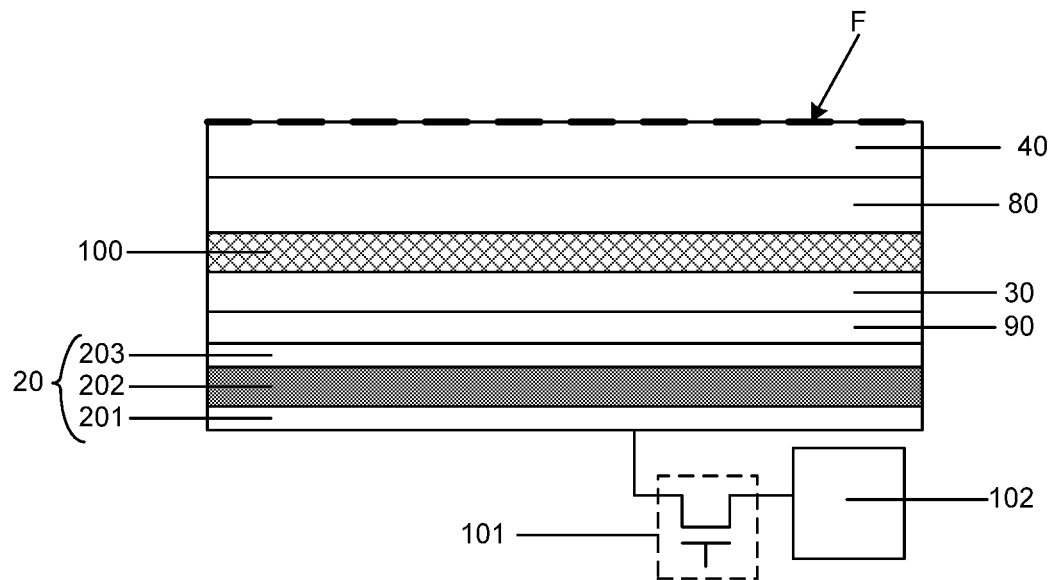
FIG. 8a is a schematic diagram showing a structure of yet another texture recognition assembly in accordance with some embodiments of the present disclosure.
Figure 8B:
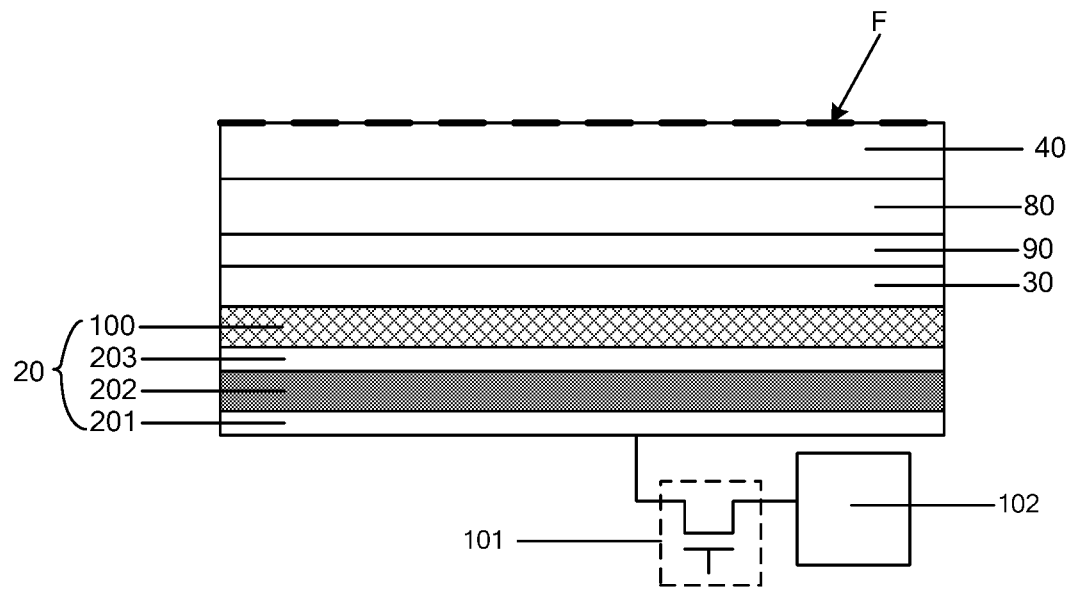
FIG. 8b is a schematic diagram showing a structure of yet another texture recognition assembly in accordance with some embodiments of the present disclosure.

In the case where the base substrate 80 is configured to be an independent film layer in the texture recognition assembly, in some embodiments of the present disclosure, as shown in FIGS. 8a and 8b, the texture recognition assembly further includes a base substrate 80 disposed at the side of the filter film layer 30 proximate to the texture contact layer 40. Herein, the first light-transmitting layer 50 is an encapsulation (e.g., thin film encapsulation, TFE) layer 100, and the second light-transmitting layer 60 is an optically transparent adhesive layer 90.

It will be noted that, as shown in FIG. 8a, the filter film layer 30 is disposed at a side of the encapsulation layer 100 proximate to the photosensitive sensing layer 20; or, as shown in FIG. 8b, the filter film layer 30 is disposed at a side of the encapsulation layer 100 away from the photosensitive sensing layer 20.

For example, as shown in FIG. 8a, in the case where the filter film layer 30 is disposed at the side of the encapsulation layer 100 proximate to the photosensitive sensing layer 20, the encapsulation layer 100 is first formed on a substrate. For example, the encapsulation layer 100 is formed on the base substrate 80. The encapsulation layer 100 is configured to encapsulate the base substrate 80. If the base substrate 80 is an OLED substrate, the encapsulation layer 100 is able to protect OLED devices in the OLED substrate from air, moisture, and the like. Then, the filter film layer 30 is directly formed and fixed on the encapsulation layer 100. Finally, a surface on the side of the filter film layer 30 away from the encapsulation layer 100 is adhered to a surface on the side of the photosensitive sensing layer 20 proximate to the filter film layer 30 by the optically transparent adhesive layer 90.

It will be understood that, in a case where the encapsulation layer 100 that encapsulates the base substrate 80 is further configured to encapsulate the photosensitive sensing layer 20, the encapsulation layer 100 will provide protection for the photosensitive sensing layer 20. That is, there will be no gap between the encapsulation layer 100 and the photosensitive sensing layer 20. As shown in FIG. 8a, the optically transparent adhesive layer 90 may be sprayed on a side of the photosensitive sensing layer 20 proximate to the encapsulation layer 100, and then a surface on the side of the filter film layer 30 away from the encapsulation layer 100 may be closely adhered to a surface on the side of the photosensitive sensing layer 20 proximate to the filter film layer 30 by the optically transparent adhesive layer 90, so as to ensure that the encapsulation layer 100 can protect the photosensitive sensing layer 20.

For example, as shown in FIG. 8b, in a case where the filter film layer 30 is disposed at the side of the encapsulation layer 100 away from the photosensitive sensing layer 20, the encapsulation layer is first formed on the photosensitive sensing layer 20. The encapsulation layer 100 is configured to encapsulate the photosensitive sensing layer 20 to protect the photosensitive sensing layer 20 from air, moisture, and the like. Then, the filter film layer 30 is directly formed and fixed on the encapsulation layer 100. Finally, the surface on the side of the filter film layer 30 away from the encapsulation layer 100 is adhered to a surface of another film layer in the texture recognition assembly by the optically transparent adhesive layer 90. For example, the surface on the side of the filter film layer 30 away from the encapsulation layer 100 is adhered to the base substrate 80 by the optically transparent adhesive layer 90.

The material of the optically transparent adhesive layer 90 is, for example, OCA.

In some embodiments of the present disclosure, the filter film layer 30 is directly formed and fixed on the encapsulation layer 100, and a fabrication method thereof is simple. Moreover, since the filter film layer 30 is directly formed and fixed on the encapsulation layer 100, in the process of fabricating the filter film layer 30, structures and performances of other layers, such as the photosensitive sensing layer, in the texture recognition assembly will not be affected even if a high temperature coating process is used.

Figure 9A:
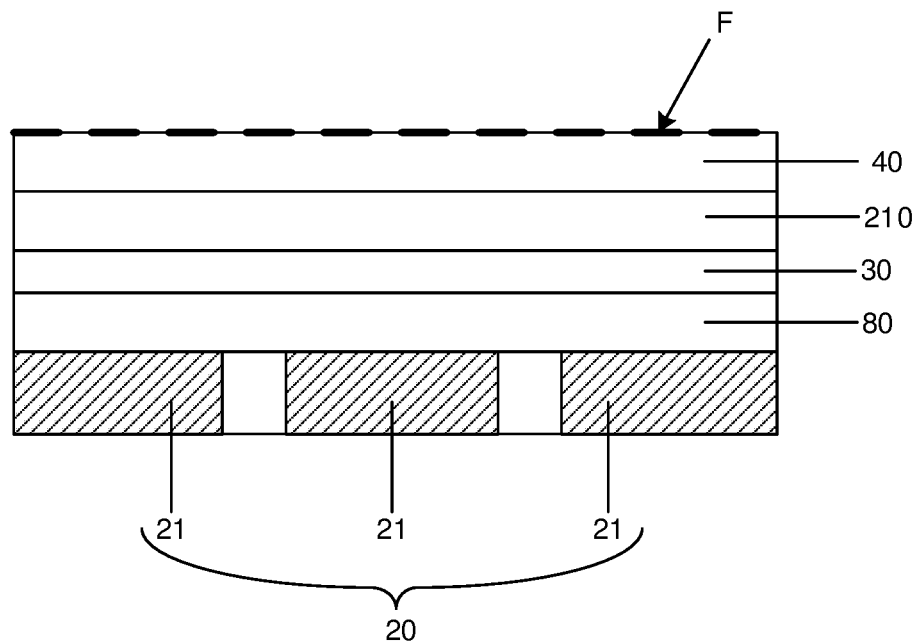
FIG. 9a is a schematic diagram showing a structure of yet another texture recognition assembly in accordance with some embodiments of the present disclosure.
Figure 9B:
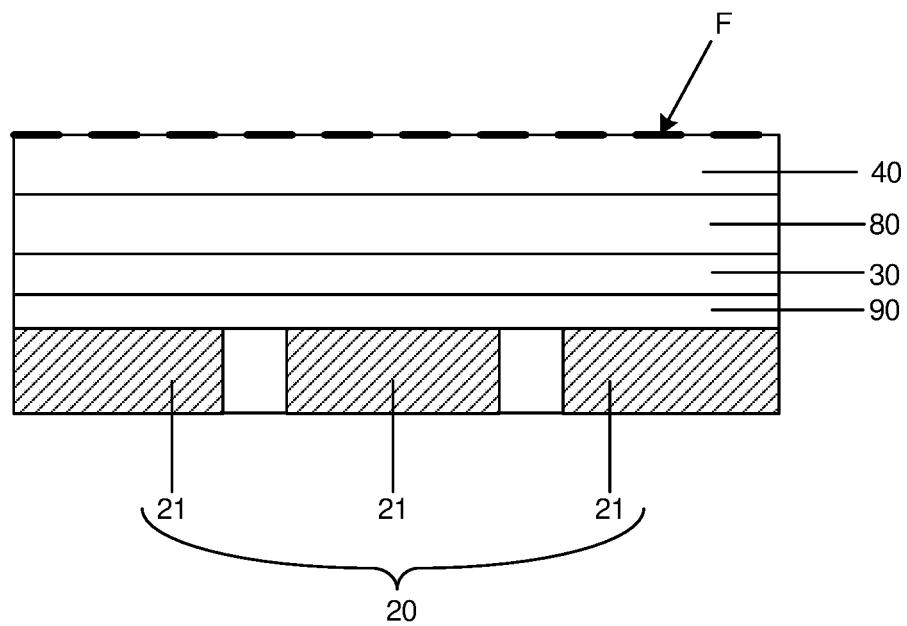
FIG. 9b is a schematic diagram showing a structure of yet another texture recognition assembly in accordance with some embodiments of the present disclosure.

In a case where the base substrate 80 is used as the first light-transmitting layer 50, in some embodiments of the present disclosure, as shown in FIGS. 9a and 9b, the first light-transmitting layer 50 is the base substrate 80, and the second light-transmitting layer 60 is an optically transparent adhesive layer 90 or a buffer layer 210.

It will be noted that, as shown in FIG. 9a, the filter film layer 30 is disposed at a side of the base substrate 80 away from the photosensitive sensing layer 20; or, as shown in FIG. 9b, the filter film layer 30 is disposed at a side of the base substrate 80 proximate to the photosensitive sensing layer 20.

For example, as shown in FIG. 9b, in a case where the filter film layer 30 is disposed at the side of the base substrate 80 away from the photosensitive sensing layer 20, the filter film layer 30 is directly formed and fixed on the base substrate 80. Then, the buffer layer 210 is formed on the side of the filter film layer 30 away from the base substrate 80.

For example, as shown in FIG. 9b, in a case where the filter film layer 30 is disposed at the side of the base substrate 80 proximate to the photosensitive sensing layer 20, the filter film layer 30 is directly formed and fixed on the base substrate 80. Then, a surface on the side of the filter film layer 30 away from the base substrate 80 is adhered to a surface of another film layer in the texture recognition assembly by the optically transparent adhesive layer 90. For example, the surface on the side of the filter film layer 30 away from the base substrate 80 is adhered to the photosensitive sensing layer 20 or the optical layer 70 by the optically transparent adhesive layer 90. Of course, after the filter film layer 30 is formed on the base substrate 80, an optical layer 70 or other film layers in the texture recognition assembly may be directly formed on the side of the filter film layer 30 away from the base substrate 80.

The optically transparent adhesive layer 90 is, for example, an OCA layer.

In embodiments of the present disclosure, the filter film layer 30 is directly formed and fixed on the base substrate 80, and a fabrication method thereof is simple. Moreover, since the filter film layer 30 is directly formed and fixed on the base substrate 80, in a process of fabricating the filter film layer 30, structures and performances of other layers, such as the photosensitive sensing layer, in the texture recognition assembly will not be affected even if a high temperature coating process is used.

A structure of the photosensitive sensing layer 20 is not limited in some embodiments of the present disclosure, as long as the photosensitive sensing layer 20 is capable of converting optical signals related to texture information into electrical signals. For example, as shown in FIGS. 8a and 8b, along a direction from the photosensitive sensing layer 20 to the filter film layer 30, the photosensitive sensing layer 20 includes a first electrode layer 201, a photosensitive material layer 202, and a second electrode layer 203 that are sequentially arranged. A material of the first electrode layer 201 is, for example, a transparent conductive material such as indium tin oxide (ITO).

Figure 11A:
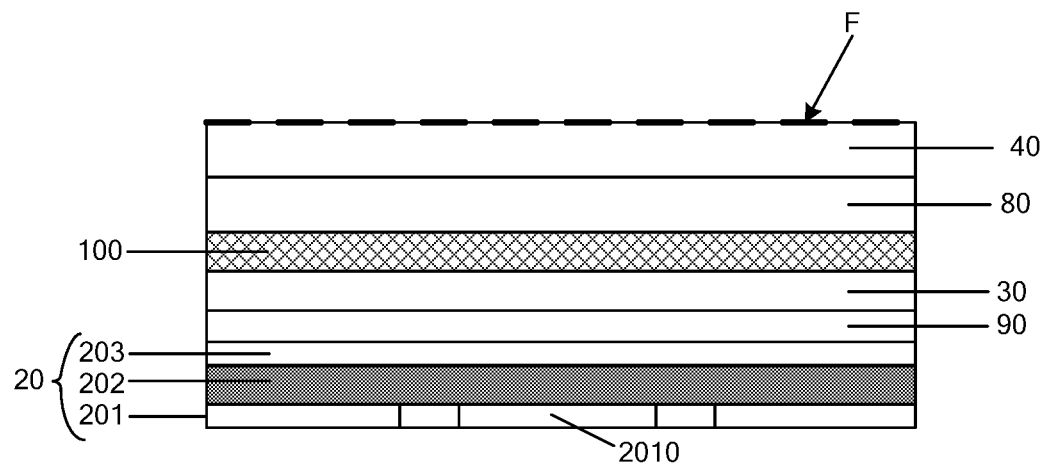
FIG. 11a is a schematic diagram showing a structure of yet another texture recognition assembly in accordance with some embodiments of the present disclosure.
Figure 11B:
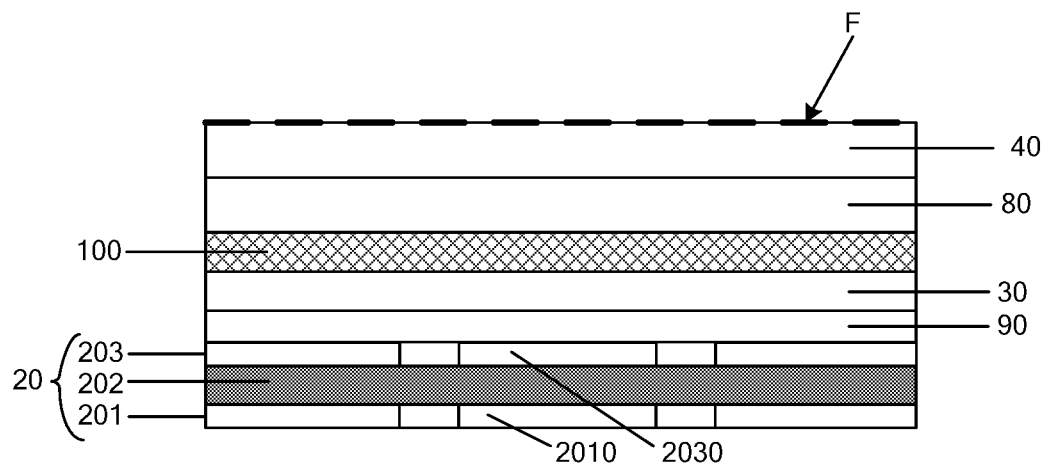
FIG. 11b is a is a schematic diagram showing a structure of yet another texture recognition assembly in accordance with some embodiments of the present disclosure.
Figure 11C:
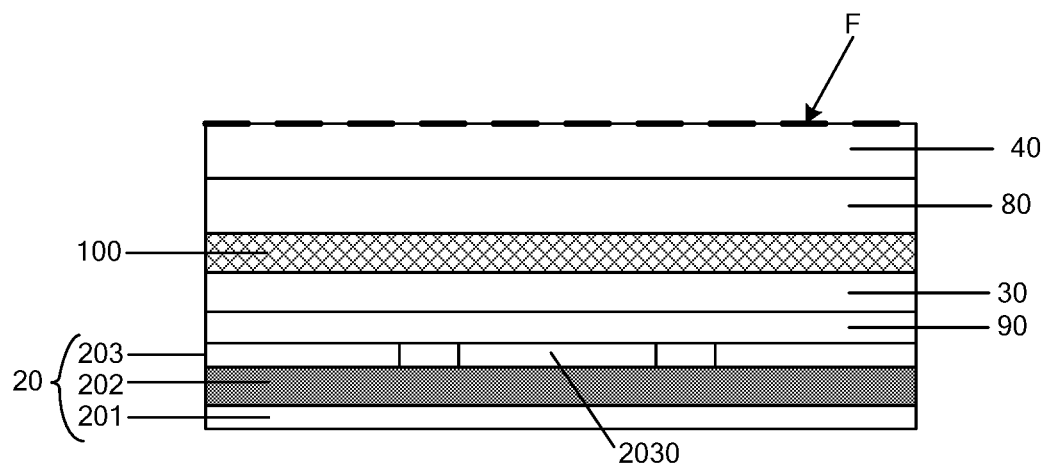
FIG. 11c is a is a schematic diagram showing a structure of yet another texture recognition assembly in accordance with some embodiments of the present disclosure.

Herein, structures of the first electrode layer 201 and the second electrode layer 203 may be varied. For example, as shown in FIG. 11*a*, the first electrode layer 201 includes a plurality of first electrodes 2010. A projection of each first electrode 2010 on the texture contact layer 40 overlaps with a projection of the second electrode layer 203 on the texture contact layer 40. For another example, as shown in FIG. 11*b*, the first electrode layer 201 includes a plurality of first electrodes 2010, and the second electrode layer 203 includes a plurality of second electrodes 2030. A projection of a single first electrode 2010 on the texture contact layer 40 overlaps with a projection of a corresponding second electrode 2030 on the texture contact layer 40. For yet another example, as shown in FIG. 11*c*, the second electrode layer 203 includes a plurality of second electrodes 2030. A projection of each second electrode 2030 on the texture contact layer 40 overlaps with a projection of the first electrode layer 201 on the texture contact layer 40.

In addition, the texture recognition assembly further includes thin film transistor(s). The thin film transistor includes a gate, a gate insulating layer, an active layer, a source and a drain. As shown in FIGS. 8*a* and 8*b*, The drain of the thin film transistor 101 is electrically connected to the first electrode layer 201 of the photosensitive sensing layer 20. The thin film transistor 101 may be used as a switch to control the photosensitive sensing layer 20 to transmit the electrical signals related to texture information to a controller 102 of the texture recognition assembly, and the controller 102 performs texture recognition according to the received electrical signals.

Figure 10:
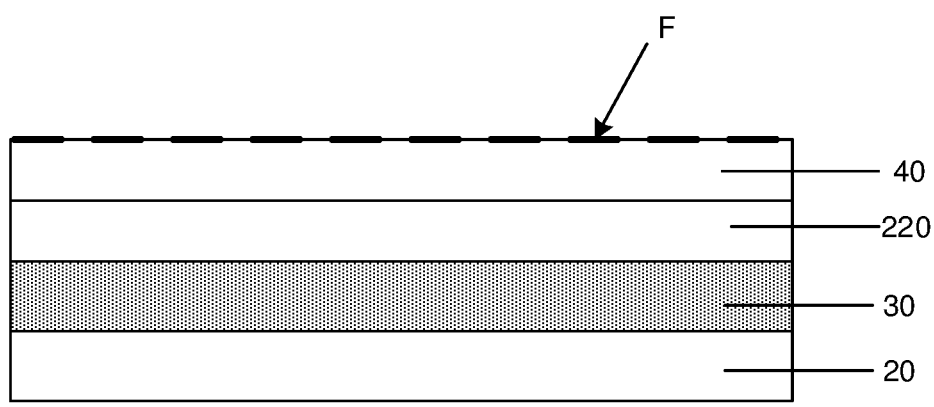
FIG. 10 is a schematic diagram showing a structure of a display apparatus in accordance with some embodiments of the present disclosure.

Some embodiments of the present disclosure provide a display apparatus. As shown in FIG. 10, the display apparatus includes a light-emitting layer 220, and the texture recognition assembly provided in any one of the above embodiments. The filter film layer 30 in the texture recognition assembly is disposed at a side of the light-emitting layer 220 away from the texture contact layer 40.

A texture contact surface F of the texture contact layer 40 is a surface closest to a display side in the display apparatus 200.

It will be noted that, first, the display apparatus 200 may be a display panel or a displayer including a display panel. The display panel may be an OLED display panel, or a liquid crystal display (LCD) panel, which is not limited in some embodiments of the present disclosure, as long as the display apparatus 200 can be used for display.

In a case where the display panel is an OLED display panel, the light-emitting layer 220 of the display apparatus 200 is a layer consisting of OLED light-emitting devices, and the OLED light-emitting devices include a cathode, an anode, and a light-emitting functional layer disposed between the cathode and the anode.

In a case where the display panel is a LCD display panel, the light-emitting layer 220 of the display apparatus 200 is a backlight source.

Second, some embodiments of the present disclosure do not limit positions of the photosensitive sensing layer 20 and the filter film layer 30, as long as the filter film layer 30 is disposed at a side of the light-emitting layer 220 of the display apparatus 200 away from the texture contact layer 40, and the photosensitive sensing layer 20 is disposed at the side of the filter film layer 30 away from the texture contact layer 40.

For example, the photosensitive sensing layer 20 and the filter film layer 30 are both disposed in the display panel, and the photosensitive sensing layer 20 and the filter film layer 30 are both located at the side of the light-emitting layer 220 away from the texture contact layer 40. Or, the filter film layer 30 is disposed in the display panel, the filter film layer 30 is located at the side of the light-emitting layer 220 away from the texture contact layer 40, and the photosensitive sensing layer 20 is disposed at a side of the display panel away from the texture contact layer 40. Or, the photosensitive sensing layer 20 and the filter film layer 30 are both disposed at the side of the display panel away from the texture contact layer 40, and the photosensitive sensing layer 20 and the filter film layer 30 are both located at the side of the light-emitting layer 220 away from the texture contact layer 40.

In a case where the filter film layer 30 is disposed in the display panel, in order to prevent a structure or performance of a display layer in the display panel from being affected during the process of fabricating the filter film layer 30, the filter film layer 30 is fabricated by an IAD process in some embodiments of the present disclosure.

In a LCD display panel, the display layer includes, for example, pixel circuits disposed in an array substrate and a liquid crystal layer disposed on the array substrate. In an OLED display panel, the display layer includes, for example, pixel circuits disposed in an array substrate and OLED light-emitting devices disposed on the array substrate.

Of course, since the light-emitting layer 220 of a LCD display apparatus is a backlight source, and the backlight source is located on a side of the LCD display panel away from the texture contact layer 40 (i.e., the LCD display panel is disposed between the light-emitting layer 220 and the texture contact layer 40), the filter film layer 30 will not be disposed in the LCD display panel.

In the display apparatus 200 provided in some embodiments of the present disclosure, the filter film layer 30 in the texture recognition assembly is disposed at the side of the light-emitting layer 220 away from the texture contact layer 40, so as to use the filter film layer 30 to filter out visible light with a wavelength greater than or equal to $\lambda$. On one hand, in a case where there is a certain distance between the finger and the photosensitive sensing layer 20, light that scatters after being reflected by the finger may be reduced by filtering out visible light with a wavelength greater than or equal to $\lambda$, thereby ensuring that the photosensitive sensing layer 20 recognizes fingerprint information more accurately. On another hand, since the portion of the ambient light that passes through the finger and reaches the photosensitive sensing layer 20 is mainly in a long band with a wavelength above 600 nm, by setting $\lambda$ to a value greater than or equal to 600 nm, it is possible to effectively filter out the portion of the ambient light that passes through the finger and reaches the photosensitive sensing layer 20, and thus improve the accuracy of fingerprint recognition. On yet another hand, the display apparatus 200 provided in some embodiments of the present disclosure is further capable of preventing the filter film layer 30 from filtering out light required for display emitted from the light-emitting layer 220 and affecting a display effect.

For example, the display apparatus 200 includes an OLED display panel; the OLED display panel includes an array substrate, and the array substrate includes a substrate. In a case where the texture recognition assembly includes a base substrate 80, the base substrate 80 is the substrate of the array substrate.

On this basis, in a case where the filter film layer 30 is disposed between the base substrate 80 and the buffer layer 210, the buffer layer 210 is, for example, a buffer layer 210 disposed at the substrate of the array substrate. Those skilled in the art will understand that, there should only be a filter film layer 30 between the substrate of the array substrate and the buffer layer 210.

In some embodiments of the present disclosure, the base substrate 80 of the texture recognition assembly is also used as the substrate of the array substrate. In this way, on one hand, a thickness of the display apparatus 200 may be reduced, which is conducive to making the display apparatus 200 thinner. On another hand, it is also possible to prevent the structure or performance of the display layer in the display apparatus 200 from being affected during a process of forming the filter film layer 30.

Embodiments of the present disclosure provide a method of manufacturing a texture recognition assembly. As shown in FIG. 3, the method includes: forming a photosensitive sensing layer 20, forming a filter film layer 30, and forming a texture contact layer. The filter film layer 30 is disposed between the photosensitive sensing layer 20 and the texture contact layer 40, and the filter film layer 30 is configured to filter visible light with a wavelength greater than or equal to $\lambda$. A value of the wavelength $\lambda$ is greater than or equal to 600 nm.

It will be noted that, first, the texture recognition assembly is configured to recognize textured objects such as a fingerprint or a palmprint, which is not limited in some embodiments of the present disclosure. For convenience of explanation, a detailed description will be given below by taking recognizing a fingerprint as an example.

Second, in the texture recognition assembly, when an user's fingerprint is being recognized, the texture contact layer 40 is in direct contact with the user's finger. As shown in FIG. 3, a surface of the texture contact layer 40 that is in direct contact with the user's finger is a texture contact surface F. In a case where the texture recognition assembly is located in a display apparatus, the texture contact surface F of the texture contact layer 40 refers to a surface of the display apparatus that is in direct contact with the user's finger when the user's fingerprint is being recognized.

The texture contact layer 40 is, for example, a cover plate on an outermost side of the texture recognition assembly or the display apparatus. The cover plate is made of, for example, glass.

Third, the description that the filter film layer 30 is used to filter visible light with a wavelength greater than or equal to $\lambda$ means that: the filter film layer 30 is able to reduce a transmittance of all visible light with a wavelength greater than or equal to $\lambda$. A specific transmittance of visible light with a wavelength greater than or equal to $\lambda$ passing through the filter film layer 30 is related to a specific structure of the filter film layer 30 and the number of layers of the film(s) in the filter film layer 30.

For example, in a case where $\lambda$ is equal to 600 nm, transmittances of light with different wavelengths passing though the filter film layer 30 are as shown in FIG. 4. The texture recognition assembly itself includes a plurality of film layers. Even though the plurality of film layers in the texture recognition assembly are made of light-transmitting materials, the film layers all have a certain transmittance. Therefore, even without passing through the filter film layer 30, light that bounces off the finger and reaches the photosensitive sensing layer 20 will be weakened to a certain extent. Based on this, it is assumed that a transmittance of light that bounces off the finger and reaches the photosensitive sensing layer 20 is 80% in a case where light does not pass through the filter film layer 30. Then, in a case where light passes through the filter film layer 30, as shown in FIG. 4, a transmittance of light with a wavelength less than 600 nm is only slightly affected by the filter film layer 30, and is still close to 80%; however, the transmittance of visible light with a wavelength greater than or equal to 600 nm is reduced from 80% to about 1%.

Fourth, some embodiments of the present disclosure do not limit a value of $\lambda$, as long as the value of $\lambda$ is above 600 nm (including 600 nm) and is within a range of visible light. For example, the value of $\lambda$ is 600 nm, 650 nm, 700 nm, 750 nm, or 800 nm.

Considering that in the test results of the spectrograph as shown in FIG. 2b, the portion of the ambient light that passes through the finger and reaches the photosensitive sensor 10 is mainly in a long band with a wavelength above 600 nm, in some embodiments of the present disclosure, the value of $\lambda$ is set to 600 nm. In this way, by choosing a suitable structure for the filter film layer 30, visible light with a wavelength greater than or equal to 600 nm may be filtered out, thereby reducing an influence of visible light with a wavelength greater than or equal to 600 nm on the accuracy of fingerprint recognition.

Fifth, some embodiments of the present disclosure do not limit a specific structure of the filter film layer 30, as long as the filter film layer 30 is able to filter out visible light with a wavelength greater than or equal to $\lambda$.

Sixth, as shown in FIGS. 6a and 6b, in some embodiments of the present disclosure, the photosensitive sensing layer 20 includes a plurality of photosensitive sensing units 21, and each photosensitive sensing unit 21 is configured to convert optical signals related to texture information into electrical signals. That is, the optical signals includes light reflected by the valley and light reflected by the ridge. The photosensitive sensing unit 21 is, for example, a photosensitive sensor, a photoelectric sensor, etc.

Seventh, some embodiments of the present disclosure do not limit an arrangement manner of the plurality of photosensitive sensing units 21 in the photosensitive sensing layer 20, as long as it is possible to perform fingerprint recognition when the finger touches any position of the texture contact surface F of the texture contact layer 40, and regions occupied by the plurality of photosensitive sensing units 21 do not affect normal display of the display apparatus in a case where the texture recognition assembly is applied to a display apparatus. The plurality of photosensitive sensing units 21 are arranged, for example, in a matrix, or in a staggered array.

Eighth, an order in which the photosensitive sensing layer 20 and the filter film layer 30 are formed is not limited in some embodiments of the present disclosure, and the order is related to a specific process used. The filter film layer 30 may be formed before the photosensitive sensing layer 20 is formed; or, the filter film layer 30 may be formed after the photosensitive sensing layer 20 is formed; or, the filter film layer 30 may be formed at a time unrelated to a time when the photosensitive sensing layer 20 is formed.

Some embodiments of the present disclosure provide a method of manufacturing a texture recognition assembly. With a filter film layer 30 disposed at the side of the photosensitive sensing layer 20 proximate to the texture contact layer 40, the texture recognition assembly is able to filter out visible light with a wavelength greater than or equal to $\lambda$. On one hand, in a case where there is a certain distance between the finger and the photosensitive sensing layer 20, light that scatters after being reflected by the finger may be reduced by filtering out visible light with a wavelength greater than or equal to λ, thereby ensuring that the photosensitive sensing layer 20 recognizes fingerprint information more accurately. On another hand, since the portion of the ambient light that passes through the finger and reaches the photosensitive sensing layer 20 is mainly in a long band with a wavelength above 600 nm, by setting λ to a value greater than or equal to 600 nm, it is possible to effectively filter out the portion of the ambient light that passes through the finger and reaches the photosensitive sensing layer 20, and thus improve the accuracy of fingerprint recognition.

In some embodiments of the present disclosure, as shown in FIG. 5, the method of manufacturing a texture recognition assembly further includes: forming a first light-transmitting layer 50 and a second light-transmitting layer 60 on both sides of the filter film layer 30 respectively. The first light-transmitting layer 50 and the second light-transmitting layer 60 are both in contact with the filter film layer 30.

In some embodiments of the present disclosure, the step of forming a filter film layer 30 includes: sequentially forming K filter film groups 31, the K filter film groups 31 being stacked, and K being a positive integer greater than or equal to 1.

A step of forming each of the K filter film groups 31 includes: sequentially forming a first film 311, a second film 312, and a first film 311. A refractive index of the second film 312 is greater than a refractive index of the first film 311. A thickness of the first film 311 is $$\frac{\lambda}{8},$$

and a thickness of the second film 312 is $$\frac{\lambda}{4}.$$

A value of K is determined according to a formula $$T = \frac{16 \cdot n_1 \cdot n_2}{\left(\frac{n_g}{n_d}\right)^{2K} \cdot \left[(n_1 + n_2)^2 + \left(\frac{n_1 \cdot n_2}{n_d} - n_d\right)^2\right]}.$$

T is a transmittance of visible light with a wavelength greater than or equal to λ in the filter film layer 30, and T is less than a threshold value of the transmittance of visible light with a wavelength greater than or equal to λ in the filter film layer 30. $n_1$ is a refractive index of the first light-transmitting layer 50, $n_2$ is a refractive index of the second light-transmitting layer 60, $n_g$ is a refractive index of the second film 312, and $n_d$ is a refractive index of the first film 311.

It will be noted that, first, the description that a first light-transmitting layer 50 and a second light-transmitting layer 60 are formed on both sides of the filter film layer 30 respectively means that: both sides of the filter film layer 30 are provided with a light-transmitting layer; and a light-transmitting layer on the side of the filter film layer 30 proximate to the photosensitive sensing layer 20 is the first light-transmitting layer 50, or a light-transmitting layer on the side of the filter film layer 30 away from the photosensitive sensing layer 20 is the first light-transmitting layer 50. For example, as shown in FIG. 5, the first light-transmitting layer 50 is disposed on the side of the filter film layer 30 proximate to the photosensitive sensing layer 20, and the second light-transmitting layer 60 is disposed on the side of the filter film layer 30 away from the photosensitive sensing layer 20. For another example, the first light-transmitting layer 50 is disposed on the side of the filter film layer 30 away from the photosensitive sensing layer 20, and the second light-transmitting layer 60 is disposed on the side of the filter film layer 30 proximate to the photosensitive sensing layer 20.

Second, first films 311 of different filter film groups 3 are made of a same material or different materials. Similarly, second films 312 of different filter film groups 3 are made of a same material or different materials. That is to say, the filter film layer 30 is composed of K filter film groups 31 with a same filter effect or different filter effects. Some embodiments of the present disclosure do not limit materials of the first film 311 and the second film 312 in each filter film group 31, as long as the refractive index of the second film 312 in each filter film group 31 is greater than the refractive index of the first film 311 in a same filter film group 31.

For example, in each filter film group 31, materials that can be easily made into a thin film by a simple process are adopted as materials of the first film 311 and the second film 312, and it is arranged that there is a large difference between refractive indexes of the first film 311 and the second film 312, so that the transmittance of visible light with a wavelength greater than or equal to λ in the filter film layer 30 is still lower. For example, in each filter film group 31, a material of the first film 311 is, for example, one of SiO or SiO$_2$, and a material of the second film 312 is, for example, one of TiO$_2$ or Ge. In a case where λ is equal to 600 nm, a refractive index of SiO$_2$ is 1.44, a refractive index of SiO is 1.8, a refractive index of TiO$_2$ is 2.12, and a refractive index of Ge is 4.0.

In each filter film group 31, the first film 311 and the second film 312 are formed by a spraying or a coating process. The coating process is, for example, a normal temperature coating process, or a high temperature coating process. The normal temperature coating process is, for example, an IAD process.

Third, the filter film layer 30 includes K filter film groups 31 that are stacked, and in a case where K>1, a plurality of filter film groups 31 are stacked along a direction from the photosensitive sensing layer 20 to the texture contact layer 40.

It will be understood by those skilled in the art that in a case where K represents the number of the filter film groups 31, K should be an integer. As for a specific value of K, in a case where T is less than the threshold value of the transmittance of visible light with a wavelength greater than or equal to λ in the filter film layer 30, the value of K is determined by the formula $$T = \frac{16 \cdot n_1 \cdot n_2}{\left(\frac{n_g}{n_d}\right)^{2K} \cdot \left[(n_1 + n_2)^2 + \left(\frac{n_1 \cdot n_2}{n_d} - n_d\right)^2\right]}.$$

FIG. 5 is a structural diagram of the filter film layer 30 in a case where K is equal to 3, but the number of the filter film groups 31 is not limited thereto in some embodiments of the present disclosure, and the number of the filter film groups 31 K may also be, for example, 2, 4, 5, 6, 8, or 10.

Fourth, those skilled in the art will understand that, since the filter film layer 30 in the embodiments of the present disclosure can filter out visible light with a wavelength greater than or equal to λ, in a case where light does not pass through the filter film layer 30, a transmittance of visible light with a wavelength greater than or equal to λ that travels from the finger to the photosensitive sensing layer 20 in the texture recognition assembly is necessarily greater than the threshold value of the transmittance of visible light with a wavelength greater than or equal to λ in the filter film layer. The threshold value of the transmittance of visible light with a wavelength greater than or equal to λ in the filter film layer is related not only to transmittances of light in the filter film layer 30 and other light-transmitting film layers in the texture recognition assembly, but also to a performance of the photosensitive sensing units 21 in the photosensitive sensing layer 20.

For example, the threshold value of the transmittance of visible light with a wavelength greater than or equal to λ in the filter film layer is less than 3%. For another example, the threshold value of the transmittance of visible light with a wavelength greater than or equal to λ in the filter film layer is less than or equal to 1%. In this case, the transmittance of light with a wavelength greater than or equal to λ that travels from the finger to the photosensitive sensing layer 20 may be considered to be close to zero and is negligible, and the accuracy of fingerprint recognition is increased to the greatest extent.

In some embodiments of the present disclosure, suitable materials are adopted so that the refractive index of the second film 312 is greater than the refractive index of the first film 311. The number of the filter film groups 30 is determined by a K value calculated on a premise that the transmittance of visible light with a wavelength greater than or equal to λ in the filter film layer 30 is less than the threshold value of the transmittance of visible light with a wavelength greater than or equal to λ in the filter film layer 30. In this way, a specific structure of the filter film layer 30 will be obtained, so that the filter film layer 30 is capable of filtering out visible light with a wavelength greater than or equal to λ. The structure of the filter film layer 30 is simple and easy to form.

In some embodiments of the present disclosure, as shown in FIGS. 6a and 6b, the method of manufacturing a texture recognition assembly further includes: forming an optical layer 70 at a side of the photosensitive sensing layer 20 proximate to the texture contact layer 40, the optical layer 70 including a plurality of light-transmitting holes. The step of forming a photosensitive sensing layer 30 includes: forming a plurality of photosensitive sensing units 21, each of the plurality of photosensitive sensing units 21 corresponding to a light-transmitting hole.

It will be noted that, some embodiments of the present disclosure do not limit an order in which the optical layer 70 and the photosensitive sensing layer 30 are formed, and the order is related to a specific process used. The optical layer 70 may be formed before the photosensitive sensing layer 20 is formed; or, the optical layer 70 may be formed after the photosensitive sensing layer 20 is formed; or, the optical layer 70 may be formed at a time unrelated to a time when the photosensitive sensing layer 20 is formed.

In some embodiments of the present disclosure, the texture recognition assembly includes a base substrate 80. The base substrate 80 may be used as the first light-transmitting layer 50, or may be configured to be an independent film layer in the texture recognition assembly, that is, in some embodiments of the present disclosure, the base substrate 80 is not used as other film layer.

In a case where the base substrate 80 is configured to be an independent film layer in the texture recognition assembly, in some embodiments of the present disclosure, as shown in FIGS. 7a and 7b, the method of manufacturing a texture recognition assembly further includes: forming a base substrate 80, and forming a texture contact layer at a side of the base substrate 80 away from the filter film layer 30.

As for a manner in which the first light-transmitting layer 50, the filter film layer 30, and the second light-transmitting layer 60 are formed in a case where the base substrate 80 is configured to be an independent film layer in the texture recognition assembly, in some embodiments of the present disclosure, the first light-transmitting layer 50, the filter film layer 30, and the second light-transmitting layer 60 are sequentially formed at a side of the base substrate 80 away from the texture contact layer 40.

For example, as shown in FIG. 7a, the filter film layer 30 is disposed at the side of the optical layer 70 proximate to the photosensitive sensing layer 20. Herein, the first light-transmitting layer 50 is an optical layer 70, and the second light-transmitting layer 60 is an optically transparent adhesive layer 90.

As shown in FIG. 7a, in a case where the filter film layer 30 is disposed at the side of the optical layer 70 proximate to the photosensitive sensing layer 20, the optical layer 70 is first formed on a substrate. For example, the optical layer 70 is formed on the base substrate 80. Then, the filter film layer 30 is directly formed and fixed on the optical layer 70. Finally, the surface on the side of the filter film layer 30 away from the optical layer 70 is adhered to a surface of another film layer in the texture recognition assembly by the optically transparent adhesive layer 90. For example, the surface on the side of the filter film layer 30 away from the optical layer 70 is adhered to the photosensitive sensing layer 20 by the optically transparent adhesive layer 90.

For example, as shown in FIG. 8a, the filter film layer 30 is disposed at the side of a encapsulation layer 100 proximate to the photosensitive sensing layer 20. Herein, the first light-transmitting layer 50 is a encapsulation layer 100, and the second light-transmitting layer 60 is an optically transparent adhesive layer 90.

As shown in FIG. 8a, in a case where the filter film layer 30 is disposed at the side of the encapsulation layer 100 proximate to the photosensitive sensing layer 20, the encapsulation layer 100 is first formed on a substrate. For example, the encapsulation layer 100 is formed on the base substrate 80. The encapsulation layer 100 is configured to encapsulate the base substrate 80. If the base substrate 80 is an OLED substrate, the encapsulation layer 100 is able to protect OLED devices in the OLED substrate from air, moisture, and the like. Then, the filter film layer 30 is directly formed and fixed on the encapsulation layer 100. Finally, a surface on the side of the filter film layer 30 away from the encapsulation layer 100 is adhered to a surface on the side of the photosensitive sensing layer 20 proximate to the filter film layer 30 by the optically transparent adhesive layer 90.

It will be understood that, if the encapsulation layer 100 that encapsulates the base substrate 80 is further configured to encapsulate the photosensitive sensing layer 20, there is no gap between the encapsulation layer 100 and the photosensitive sensing layer 20. That is, as shown in FIG. 8a, the optically transparent adhesive layer 90 may be sprayed on a side of the photosensitive sensing layer 20 proximate to the encapsulation layer 100, and then the surface on the side of the filter film layer 30 away from the encapsulation layer 100 may be closely adhered to the surface on the side of the photosensitive sensing layer 20 proximate to the filter film layer 30 by the optically transparent adhesive layer 90, so as to ensure that the encapsulation layer 100 can protect the photosensitive sensing layer 20.

As for a manner in which the first light-transmitting layer 50, the filter film layer 30, and the second light-transmitting layer 60 are formed in a case where the base substrate 80 is configured to be an independent film layer in the texture recognition assembly, in some embodiments of the present disclosure, the first light-transmitting layer 50, the filter film layer 30, and the second light-transmitting layer 60 are sequentially formed at a side of the photosensitive sensing layer 20 proximate to the base substrate 80.

For example, as shown in FIG. 7b, the filter film layer 30 is disposed at the side of the optical layer 70 away from the photosensitive sensing layer 20. Herein, the first light-transmitting layer 50 is an optical layer 70, and the second light-transmitting layer 60 is an optically transparent adhesive layer 90.

As shown in FIG. 7b, in a case where the filter film layer 30 is disposed at the side of the optical layer 70 away from the photosensitive sensing layer 20, the optical layer 70 is directly formed on the photosensitive sensing layer 20, or the optical layer 70 is adhered to the photosensitive sensing layer 20. Then, the filter film layer 30 is directly formed and fixed on the optical layer 70. Finally, the surface on the side of the filter film layer 30 away from the optical layer 70 is adhered to a surface of another film layer in the texture recognition assembly by the optically transparent adhesive layer 90. For example, the surface on the side of the filter film layer 30 away from the optical layer 70 is adhered to the base substrate 80 by the optically transparent adhesive layer 90.

For another example, as shown in FIG. 8b, the filter film layer 30 is disposed at the side of the encapsulation layer 100 away from the photosensitive sensing layer 20. Herein, the first light-transmitting layer 50 is a TFE encapsulation layer 100, and the second light-transmitting layer 60 is an optically transparent adhesive layer 90.

As shown in FIG. 8b, in a case where the filter film layer 30 is disposed at a side of the encapsulation layer 100 away from the photosensitive sensing layer 20, the encapsulation layer 100 is first formed on the photosensitive sensing layer 20. The encapsulation layer 100 is configured to encapsulate the photosensitive sensing layer 20, so as to protect the photosensitive sensing layer 20 from air, moisture, and the like. Then, the filter film layer 30 is directly formed and fixed on the encapsulation layer 100. Finally, the surface on the side of the filter film layer 30 away from the encapsulation layer 100 is adhered to a surface of another film layer in the texture recognition assembly by the optically transparent adhesive layer 90. For example, the surface on the side of the filter film layer 30 away from the encapsulation layer 100 is adhered to the base substrate 80 by the optically transparent adhesive layer 90.

In some embodiments of the present disclosure, the filter film layer 30 is directly formed and fixed on the encapsulation layer 100, and a fabrication method thereof is simple. Moreover, since the filter film layer 30 is directly formed and fixed on the optical layer 70 or the encapsulation layer 100, in the process of fabricating the filter film layer 30, structures and performances of other layers, such as the photosensitive sensing layer, in the texture recognition assembly will not be affected even if a high temperature coating process is used.

In a case where the base substrate 80 is used as the first light-transmitting layer 50, in some embodiments of the present disclosure, as shown in FIGS. 9a and 9b, the first light-transmitting layer 50 is the base substrate 80.

As for a manner in which the filter film layer 30 and the second light-transmitting layer 60 are formed in the case where the base substrate 80 is used as the first light-transmitting layer 50, in some embodiments of the present disclosure, the filter film layer 30 and the second light-transmitting layer 60 are sequentially formed at the side of the base substrate 80 proximate to the texture contact layer 40. The second light-transmitting layer 60 is the buffer layer 210.

For example, as shown in FIG. 9a, the filter film layer 30 is disposed at the side of the base substrate 80 away from the photosensitive sensing layer 20. In this case, the filter film layer 30 is directly formed and fixed on the base substrate 80. Then, the buffer layer 210 is formed on the side of the filter film layer 30 away from the base substrate 80.

As for a manner in which the filter film layer 30 and the second light-transmitting layer 60 are formed in the case where the base substrate 80 is used as the first light-transmitting layer 50, in some embodiments of the present disclosure, the filter film layer 30 and the second light-transmitting layer 60 are sequentially formed at the side of the base substrate 80 proximate to the photosensitive sensing layer 20. The second light-transmitting layer 60 is the optically transparent adhesive layer 90.

For example, as shown in FIG. 9b, the filter film layer 30 is disposed at the side of the base substrate 80 proximate to the photosensitive sensing layer 20. In this case, the filter film layer 30 is directly formed and fixed on the base substrate 80. Then, the surface on the side of the filter film layer 30 away from the base substrate 80 is adhered to a surface of another film layer in the texture recognition assembly by the optically transparent adhesive layer 90. For example, the surface on the side of the filter film layer 30 away from the base substrate 80 is adhered to the photosensitive sensing layer 20 or the optical layer 70 by the optically transparent adhesive layer 90. Of course, after the filter film layer 30 is formed on the base substrate 80, the optical layer 70 or other film layers in the texture recognition assembly may be directly formed on the side of the filter film layer 30 away from the base substrate 80.

In some embodiments of the present disclosure, the filter film layer 30 is directly formed and fixed on the base substrate 80, and the fabrication method thereof is simple. Moreover, since the filter film layer 30 is directly formed and fixed on the base substrate 80, in the process of fabricating the filter film layer 30, structures and performances of other layers, such as the photosensitive sensing layer, in the texture recognition assembly will not be affected even if a high temperature coating process is used.

In some embodiments of the present disclosure, as shown in FIGS. 8a and 8b, the step of forming a photosensitive sensing layer 20 includes: sequentially forming a first electrode layer 201, a photosensitive material layer 202, and a second electrode layer 203. A material of the first electrode layer 201 is, for example, a transparent conductive material such as ITO.

As for structures of the first electrode layer 201 and the second electrode layer 203, reference may be made to structures in the foregoing embodiments, and details are not described herein again.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A texture recognition assembly, comprising:
a photosensitive sensing layer;
a texture contact layer;
a filter film layer disposed at a side of the photosensitive sensing layer proximate to the texture contact layer, wherein the filter film layer is configured to filter visible light with a wavelength greater than or equal to λ, and a value of λ is greater than or equal to 600 nm; and
a first light-transmitting layer and a second light-transmitting layer are disposed on a first side and a second side of the filter film layer respectively, and the first light-transmitting layer and the second light-transmitting layer are both in contact with the filter film layer;
wherein the filter film layer includes K filter film groups that are stacked, K being a positive integer greater than or equal to 1; and
each of the K filter film groups includes:
two first films disposed opposite to each other; and
a second film disposed between the two first films, wherein
a refractive index of the second film is greater than a refractive index of the first film;
a thickness of the first film is $$\frac{\lambda}{8},$$

and a thickness of the second film is $$\frac{\lambda}{4};$$

and
a value of K is determined according to a formula $$T = \frac{16 \cdot n_1 \cdot n_2}{\left(\frac{n_g}{n_d}\right)^{2K} \cdot \left[(n_1 + n_2)^2 + \left(\frac{n_1 \cdot n_2}{n_d} - n_d\right)^2\right]},$$

wherein
T is a transmittance of visible light with a wavelength greater than or equal to λ in the filter film layer, and T is less than a threshold value of the transmittance of visible light with a wavelength greater than or equal to λ in the filter film layer; $n_1$ is a refractive index of the first light-transmitting layer, $n_2$ is a refractive index of the second light-transmitting layer, $n_g$ is a refractive index of the second film, and $n_d$ is a refractive index of the first film.

2. The texture recognition assembly according to claim 1, wherein the threshold value of the transmittance of visible light with a wavelength greater than or equal to λ in the filter film layer is less than 3%; or the threshold value of the transmittance of visible light with a wavelength greater than or equal to λ in the filter film layer is equal to 3%.

3. The texture recognition assembly according to claim 1, wherein
a material of the first film includes SiO or $SiO_2$; and
a material of the second film includes $TiO_2$ or Ge.

4. The texture recognition assembly according to claim 1, wherein the first light-transmitting layer includes a base substrate, and the second light-transmitting layer includes an optically transparent adhesive layer or a buffer layer.

5. The texture recognition assembly according to claim 1, further comprising a base substrate disposed at a side of the filter film layer proximate to the texture contact layer;
the first light-transmitting layer includes an optical layer or an encapsulation layer; and
the second light-transmitting layer includes an optically transparent adhesive layer.

6. The texture recognition assembly according to claim 1, wherein the texture recognition assembly further comprises an optical layer disposed at the side of the photosensitive sensing layer proximate to the texture contact layer; the optical layer includes a plurality of light-transmitting holes; and
the photosensitive sensing layer includes a plurality of photosensitive sensing units, and each of the plurality of photosensitive sensing units corresponds to a light-transmitting hole.

7. The texture recognition assembly according to claim 1, wherein along a direction from the photosensitive sensing layer to the filter film layer, the photosensitive sensing layer includes a first electrode layer, a photosensitive material layer, and a second electrode layer that are sequentially arranged.

8. A display apparatus, comprising:
a light-emitting layer; and
the texture recognition assembly according to claim 1, wherein
the filter film layer in the texture recognition assembly is disposed at a side of the light-emitting layer away from the texture contact layer in the texture recognition assembly.

9. The texture recognition assembly according to claim 6, wherein the optical layer is disposed at a side of the filter film layer proximate to the photosensitive sensing layer; or
the optical layer is disposed at a side of the filter film layer away from the photosensitive sensing layer.

10. The texture recognition assembly according to claim 7, further comprising:
at least one thin film transistor electrically connected to the first electrode layer; and
a controller electrically connected to the at least one thin film transistor, wherein
the photosensitive sensing layer is configured to convert received optical signals related to texture information into electrical signals;
the at least one thin film transistor is configured to control the photosensitive sensing layer to transmit the electrical signals to the controller; and
the controller is configured to perform texture recognition according to the received electrical signals.

11. The texture recognition assembly according to claim 7, wherein an arrangement manner of the first electrode layer and the second electrode layer includes at least one of:
the first electrode layer includes a plurality of first electrodes, a projection of each first electrode on the texture contact layer overlaps with a projection of the second electrode layer on the texture contact layer;

the first electrode layer includes a plurality of first electrodes, and the second electrode layer includes a plurality of second electrodes, a projection of a single first electrode on the texture contact layer overlaps with a projection of a corresponding second electrode on the texture contact layer; or the second electrode layer includes a plurality of second electrodes, a projection of each second electrode on the texture contact layer overlaps with a projection of the first electrode layer on the texture contact layer.

12. The display apparatus according to claim 8, further comprising an organic light-emitting diode (OLED) display panel, wherein the light-emitting layer is a layer consisting of a plurality of OLED light-emitting devices of the OLED display panel; the OLED display panel includes an array substrate, and the array substrate includes a substrate; and the texture recognition assembly includes a base substrate, and the base substrate is used as the substrate of the array substrate.

13. A method of manufacturing a texture recognition assembly, comprising:

forming a photosensitive sensing layer;

forming a filter film layer; and forming a texture contact layer, wherein the filter film layer is disposed between the photosensitive sensing layer and the texture contact layer, and the filter film layer is configured to filter visible light with a wavelength greater than or equal to λ; and a value of λ is greater than or equal to 600 nm;

the method further comprises forming a first light-transmitting layer and a second light-transmitting layer on a first side and a second side of the filter film layer respectively, wherein the first light-transmitting layer and the second light-transmitting layer are in contact with the filter film layer respectively.

14. The method of manufacturing the texture recognition assembly according to claim 13, wherein forming the filter film layer includes:

sequentially forming K filter film groups, the K filter film groups being stacked, and K being a positive integer greater than or equal to 1, wherein a step of forming each of the K filter film groups includes: sequentially forming a first film, a second film, and a first film, wherein a refractive index of the second film is greater than a refractive index of the first film;

a thickness of the first film is $$\frac{\lambda}{8},$$

and a thickness of the second film is $$\frac{\lambda}{4};$$

and a value of K is determined according to a formula $$T = \frac{16 \cdot n_1 \cdot n_2}{\left(\frac{n_g}{n_d}\right)^{2K} \cdot \left[(n_1 + n_2)^2 + \left(\frac{n_1 \cdot n_2}{n_d} - n_d\right)^2\right]},$$

wherein

T is a transmittance of visible light with a wavelength greater than or equal to λ, in the filter film layer, and T is less than a threshold value of the transmittance of visible light with a wavelength greater than or equal to λ, in the filter film layer; $n_1$ is a refractive index of the first light-transmitting layer, $n_2$ is a refractive index of the second light-transmitting layer, $n_g$ is a refractive index of the second film, and $n_d$ is a refractive index of the first film.

15. The method of manufacturing the texture recognition assembly according to claim 13, wherein forming the first light-transmitting layer includes forming a base substrate; and forming the second light-transmitting layer includes forming a buffer layer, wherein the filter film layer and the second light-transmitting layer are sequentially formed at a side of the base substrate proximate to the texture contact layer; or forming the first light-transmitting layer includes forming a base substrate; and forming the second light-transmitting layer includes forming an optically transparent adhesive layer, wherein the filter film layer and the second light-transmitting layer are sequentially formed at a side of the base substrate proximate to the photosensitive sensing layer.

16. The method of manufacturing the texture recognition assembly according to claim 13, further comprising: forming a base substrate, wherein foming the texture contact layer includes forming the texture contact layer at a side of the base substrate away from the filter film layer;

foming the first light-transmitting layer includes forming an optical layer or an encapsulation layer; and foming the second light-transmitting layer includes forming an optically transparent adhesive layer, wherein the first light-transmitting layer, the filter film layer and the second light-transmitting layer are sequentially formed at a side of the base substrate away from the texture contact layer; or the first light-transmitting layer, the filter film layer and the second light-transmitting layer are sequentially formed at a side of the photosensitive sensing layer proximate to the base substrate.

17. The method of manufacturing the texture recognition assembly according to claim 13, further comprising:

forming an optical layer at a side of the photosensitive sensing layer proximate to the texture contact layer, the optical layer including a plurality of light-transmitting holes;

and forming the photosensitive sensing layer includes forming a plurality of photosensitive sensing units, each of the plurality of photosensitive sensing units corresponding to a light-transmitting hole.

18. The method of manufacturing the texture recognition assembly according to claim 13, wherein forming the photosensitive sensing layer includes:

sequentially forming a first electrode layer, a photosensitive material layer, and a second electrode layer.

* * * * *